United States Patent
Chan et al.

(10) Patent No.: US 12,457,785 B2
(45) Date of Patent: Oct. 28, 2025

(54) METHOD FOR FORMING A STACKED FET DEVICE

(71) Applicant: IMEC VZW, Leuven (BE)

(72) Inventors: Boon Teik Chan, Wilsele (BE); Anne Vandooren, Mazy (BE); Naoto Horiguchi, Leuven (BE)

(73) Assignee: Imec vzw, Leuven (BE)

( * ) Notice: Subject to any disclaimer, the term of this patent is extended or adjusted under 35 U.S.C. 154(b) by 484 days.

(21) Appl. No.: 18/065,353

(22) Filed: Dec. 13, 2022

(65) Prior Publication Data

US 2023/0197830 A1    Jun. 22, 2023

(30) Foreign Application Priority Data

Dec. 17, 2021 (EP) .................................... 21215360

(51) Int. Cl.
*H10D 64/01*    (2025.01)
*H01L 21/311*    (2006.01)
(Continued)

(52) U.S. Cl.
CPC ..... *H10D 64/017* (2025.01); *H01L 21/31144* (2013.01); *H01L 21/3213* (2013.01);
(Continued)

(58) Field of Classification Search
CPC .. H10D 64/017; H10D 64/018; H10D 64/015; H10D 64/021; H10D 62/118;
(Continued)

(56) References Cited

U.S. PATENT DOCUMENTS

| | | |
|---|---|---|
| 2019/0355756 A1 | 11/2019 | Nelson et al. |
| 2020/0006330 A1 | 1/2020 | Lilak et al. |

(Continued)

OTHER PUBLICATIONS

Extended European Search Report dated May 30, 2022 issued in European Patent Application No. 21215360.5.

(Continued)

*Primary Examiner* — Tuan A Hoang
(74) *Attorney, Agent, or Firm* — McDonnell Boehnen Hulbert & Berghoff LLP

(57) ABSTRACT

A method for forming a stacked field-effect transistor device is provided. The method including: forming a bottom FET device comprising a bottom gate electrode arranged; forming a bonding layer of dielectric bonding material over the bottom FET device; and forming a top FET device on the bonding layer, including: forming a fin structure comprising a channel layer; etching through the bonding layer to form a bonding layer pattern comprising the dielectric bonding material underneath the fin structure; forming a dummy gate and a dummy gate spacer layer; forming cuts in the fin structure and the bonding layer pattern; forming recesses underneath a fin structure portion preserved underneath the dummy gate by laterally etching back side surface portions of a bonding layer pattern portion; removing the first spacer layer and subsequently forming a second spacer layer covering the side surfaces of the dummy gate and filling the recesses; removing the dummy gate selectively to the second spacer layer to form an upper gate cavity portion exposing the fin structure portion; forming a lower gate cavity portion exposing an upper surface of the bottom gate electrode, comprising removing the bonding layer pattern portion by subjecting the bonding layer pattern portion to an isotropic etching process via the upper gate cavity; and forming a gate electrode in the upper and lower gate cavity portions.

17 Claims, 10 Drawing Sheets

(51) Int. Cl.
- *H01L 21/3213* (2006.01)
- *H10D 30/01* (2025.01)
- *H10D 84/01* (2025.01)
- *H10D 84/03* (2025.01)
- *H10D 30/62* (2025.01)
- *H10D 30/67* (2025.01)
- *H10D 62/10* (2025.01)
- *H10D 84/85* (2025.01)

(52) U.S. Cl.
CPC .......... *H10D 30/014* (2025.01); *H10D 64/01* (2025.01); *H10D 64/015* (2025.01); *H10D 64/018* (2025.01); *H10D 64/021* (2025.01); *H10D 84/0167* (2025.01); *H10D 84/0186* (2025.01); *H10D 84/038* (2025.01); *H10D 30/62* (2025.01); *H10D 30/6735* (2025.01); *H10D 30/6757* (2025.01); *H10D 62/121* (2025.01); *H10D 84/856* (2025.01)

(58) Field of Classification Search
CPC .... H10D 62/119; H10D 62/121; H10D 30/67; H10D 30/6735
See application file for complete search history.

(56) References Cited

U.S. PATENT DOCUMENTS

2020/0126987 A1* 4/2020 Rubin ................ H10D 84/0186
2023/0178553 A1* 6/2023 Xie ........................ H10D 88/00
257/351

OTHER PUBLICATIONS

Chehab, Bilal et al., "Design-Technology Co-Optimization of Sequential and Monolithic CFET as Enabler of Technology Note Beyond 2nm," Algorithms and Technologies for Multispectral, Hyperspectral, and Ultraspectral Imagery XIX-Proceedings of SPIE, SPIE, US, 2021, vol. 11614, pp. 11614OD1-11614OD5.

* cited by examiner

METHOD FOR FORMING A STACKED FET DEVICE

CROSS-REFERENCE

This application claims priority from European patent application no. 21215360.5, filed Dec. 17, 2021, which is incorporated by reference in its entirety.

TECHNICAL FIELD

The present disclosure relates to a method for forming a stacked field-effect transistor (FET) device, e.g. a complementary field-effect transistor (CFET) device.

BACKGROUND OF THE PRESENT DISCLOSURE

A Complementary Field-Effect Transistor (CFET) is a transistor device having a complementary pair of FETs, stacked on top of each other (e.g. an nFET device stacked on top of a pFET device or vice versa). The CFET allows a reduced footprint compared to a traditional side-by-side arrangement of a pFET and nFET. The two device levels provided by the CFET (e.g. a "2-level middle-of line/MOL") further enables a reduced routing layer usage (e.g. in the back-end-of line/BEOL). The CFET hence facilitates realization of area efficient circuitry.

A CFET device may be formed using a monolithic approach or a sequential approach. A "monolithic" CFET may comprise a gate electrode which is physically and electrically common (i.e. a monolithic gate electrode) to the top and bottom device. Meanwhile, a "sequential CFET" allows separate gate electrodes for the top and bottom devices.

In certain types of circuit cells, it is desirable to have an electrically connected gate. In the case of a sequential CFET this can be achieved by a short vertical top-to-bottom-gate-via connecting the gates of the top and bottom FET. However, forming such a connection can entail complications. Thus, there is a need for improved ways of forming a sequential CFET having electrically connected top and bottom gate electrodes.

SUMMARY OF THE PRESENT DISCLOSURE

It is an object of the present disclosure to address this need and provide an improved method for forming a stacked field-effect transistor device, e.g. a sequential CFET, with a common gate electrode.

According to an aspect of the present disclosure, a method for forming a stacked field-effect transistor, FET, device is provided. The method comprises:
forming a bottom FET device comprising a source, a drain, a channel layer between the source and drain, and a bottom gate electrode arranged along the channel layer;
forming a bonding layer of dielectric bonding material over the bottom FET device; and
forming a top FET device on the bonding layer, wherein forming the top FET device comprises:
forming on the bonding layer a fin structure comprising a channel layer;
etching through the bonding layer to form a bonding layer pattern comprising the dielectric bonding material underneath the fin structure;
forming a dummy gate extending across the fin structure;
forming a first spacer layer comprising portions covering side surfaces of the dummy gate to define a dummy gate spacer, and portions covering side surfaces of the fin structure and the bonding layer pattern;
subsequent to forming the first spacer layer, forming cuts in the fin structure and the bonding layer pattern, comprising etching through the fin structure and then the bonding layer pattern at either side of the dummy gate such that a fin structure portion on a bonding layer pattern portion is preserved underneath the dummy gate and the dummy gate spacer, wherein the fin structure portion and the bonding layer pattern portion are located above the bottom gate electrode;
forming recesses underneath the fin structure portion by laterally etching back side surface portions of the bonding layer pattern portion exposed at either side of the dummy gate;
removing the first spacer layer and subsequently forming a second spacer layer covering the side surfaces of the dummy gate and filling the recesses and exposing end surfaces of the channel layer of the fin structure portion at either side of the dummy gate;
wherein, subsequent to forming the second spacer layer, the method further comprises:
epitaxially growing source/drain bodies on the exposed end surfaces of the channel layer;
subsequently, removing the dummy gate selectively to the second spacer layer to form an upper gate cavity portion exposing the fin structure portion;
forming a lower gate cavity portion exposing an upper surface of the bottom gate electrode, comprising removing the bonding layer pattern portion by subjecting the bonding layer pattern portion to an isotropic etching process via the upper gate cavity, wherein the etching process etches the dielectric bonding material selectively to a spacer material of the second spacer layer; and
forming a gate electrode in the upper and lower gate cavity portions, comprising an upper gate electrode portion extending along the channel layer, and a lower gate electrode portion in contact with the upper surface of the bottom gate electrode.

The method for forming a stacked FET device enables an improved way of forming a common gate electrode in the FET device. The wording "common gate electrode" means the gate electrode (i.e. the "top gate electrode") formed in the upper and lower gate cavity portions together with the bottom gate electrode that is in contact with the lower gate portion.

In particular, the method allows forming the common gate electrode in a space directly underneath the channel layer by removing a portion of the bonding layer overlapped by the channel layer (as seen along a vertical direction) employing an isotropic etching process. This enables forming a top-to-bottom gate electrode connection without the need to form the bottom and top gate electrodes with a respective increased side gate extension, protruding laterally to the side of the channel layers. Increased side gate extensions may otherwise result in increased parasitic capacitance. Additionally, the portion of the top gate electrode formed in the lower gate cavity portion may provide a gate-to-gate contact with an increased cross-sectional area (i.e. in a horizontal plane), and hence a reduced resistivity.

During the isotropic etching of the dielectric bonding material, the second spacer (of the spacer material which is different from the dielectric bonding material) may be used as an etch mask, laterally confining the isotropic etching to the gate cavity portions, and thus masking the source/drain regions from the isotropic etching process.

Relative spatial terms such as "top", "upper" "bottom", "lower", "underneath", "vertical", "stacked on top of", "over", "laterally", and "horizontal" are used to refer to locations or directions within a frame of reference of the stacked FET device. In particular, "top", "bottom", "lower", "vertical" and "stacked on top of" may be understood in relation to a bottom-up direction of the stacked FET device (i.e. a direction from the bottom FET towards the top FET), or equivalently a normal direction to a substrate on which the stacked FET device is formed, in particular a main plane of extension of the substrate. Correspondingly, the terms "horizontal" and "laterally" may be understood as locations or orientations transverse to the bottom-up direction, i.e. in relation to/along (the main plane of extension of) the substrate.

The wording "stacked field-effect transistor device" means a device comprising a bottom FET and a top FET stacked on top of the bottom FET. More specifically, the top FET may be arranged directly above the bottom FET. "Directly above" is hereby to be understood as a relative arrangement of the bottom and top FET such that the respective source and drain of the bottom FET and the top FET, and the bottom and top gate electrode intersect a common geometrical vertical plane. The stacked FET device may be a so-called complementary FET device. That is, the bottom FET may be of a first conductivity type (e.g. n-type) and the top FET may be of a second opposite conductivity type (e.g. p-type) stacked on top of the bottom FET.

The wording channel layer "between" the source and drain refers to the channel layer extending between and connecting the source and the drain. More specifically, the channel layer may be a horizontally oriented channel layer, e.g. extending between the source and the drain in a horizontal direction.

The wording "arranged along" as in "a bottom gate electrode arranged along the at least one channel layer" means that the bottom gate electrode is provided on one or more sides of the channel layer.

The wording "bonding layer" means a layer or composite layer structure arranged between the top and bottom FET for bonding the top and bottom FET together. The common gate electrode may thus form a connection bridging the (insulating) bonding layer.

As used herein, the wording "selective" in connection with "removal" or "etching" of a layer or a material means a removal of the layer or the material by a selective etching process, wherein a removal rate/etch rate of the layer or the material to be selectively removed/etched exceeds a removal rate/etch rate of at least one other layer or material exposed to the etching process.

The dummy gate may be formed prior to etching the bonding layer, wherein the dummy gate and the fin structure may be used as an etch mask while etching the bonding layer such that the bonding layer pattern comprises the dielectric bonding material underneath the fin structure and the dielectric bonding material underneath the dummy gate.

Forming the dummy gate prior to etching the bonding layer may be beneficial in that it may reduce a risk of metal contamination from the bottom gate electrode, or of a metal-oxide based etch stop layer which in some embodiments may be present.

Alternatively, the dummy gate may be formed after etching through the bonding layer, and thus extend across the fin structure and the bonding layer pattern underneath the fin structure.

The method may further comprise depositing a dielectric cover material over the source/drain bodies and a mask layer over the dielectric cover material, wherein the mask layer may act as an etch mask while removing the bonding layer pattern portion.

The source/drain bodies and the dielectric cover material may hence be masked from above by the mask layer, and laterally/from the sides by the second spacer layer.

The mask layer may further act as an etch mask while removing the dummy gate.

A capping layer of a hard mask material may be provided on the dummy gate, wherein the mask layer may be formed to cover the dielectric cover material and expose the capping layer. The method may further comprise opening the capping layer selectively to the mask layer to expose the dummy gate and thereafter removing the dummy gate.

The method may further comprise, subsequent to removing the dummy gate, conformally depositing a gate dielectric layer, wherein forming the top gate electrode may comprise depositing a gate electrode material. The method may further comprise opening the gate dielectric layer using a top-down anisotropic etch prior to depositing the gate electrode material.

By the wording "conformal deposition" is hereby meant a deposition process resulting in a conformally growing layer or film. Conformal deposition may be achieved using an atomic layer deposition (ALD) process.

A conformal deposition of the gate dielectric can facilitate deposition of a high quality film, with uniform thickness and reliable coverage of surfaces in any orientation, e.g. including vertically oriented side surfaces of the channel layer as well as a horizontally oriented bottom surface of the channel layer.

By opening the gate dielectric using a top-down anisotropic etch prior to depositing the gate electrode material, a portion of the gate dielectric deposited on a bottom surface of the lower gate cavity portion. Thereby, the top gate electrode may be formed in direct contact with the bottom gate electrode. More specifically, by etching the gate dielectric in a top-down direction, the gate dielectric may be removed from a portion of the bottom surface of the lower gate cavity portion adjacent the channel layer, or from a pair of portions of the bottom surface adjacent to and at opposite sides with respect to the channel layer.

The fin structure portion may further comprise a dummy layer of a dummy dielectric material above the channel layer, wherein the dummy layer of the fin structure portion counteracts etching of the portion of the gate dielectric layer deposited on the channel layer, during the top-down anisotropic etch used to open the gate dielectric layer.

Having the dummy layer above the channel layer may be beneficial in reducing a risk of damage to the portion of the gate dielectric deposited on the channel layer, and to damage the channel layer. The dummy layer may thus as an etch mask, preventing etching of the channel layer of the top FET, arranged below the dummy layer, e.g. during the top-down anisotropic etch used to open the gate dielectric layer.

Since the dummy layer is formed of a dielectric dummy material, the dummy layer will, however, not form an electrically active part of the top FET, and presence of gate dielectric on the dummy layer is hence not a requirement for a proper device operation.

The dummy material may be formed of a dielectric material different from a material of the bonding layer. This allows for the dummy layer to serve as an etch mask during the etching of the bonding layer to form the bonding layer pattern. In other words, the isotropic etching process used to remove the bonding layer pattern portion may etch the dielectric bonding material selectively to both the spacer material and the dummy material.

The method may further comprise conformally depositing a work function metal layer on the gate dielectric layer, and opening the work function metal layer using a top-down anisotropic etch and then opening the gate dielectric layer, wherein the dummy layer further counteracts etching of the portion of the work function metal layer deposited on said portion of the gate dielectric layer deposited on the channel layer during the top-down anisotropic etch used to open the work function metal layer.

Presence of the work function metal between the bottom gate electrode and the gate electrode of the top FET may hence be avoided, which otherwise could tend to result in an increased contact resistance between the top and bottom gate electrodes.

The gate electrode material may, subsequent to opening the work function metal layer, be deposited on the remaining portions of the work function metal layer, such that the remaining portions of the work function metal layer forms part of the gate electrode.

The fin structure may further comprise a sacrificial layer of a sacrificial semiconductor material between the channel layer and the dummy layer. The method may further comprise:

subsequent to removing the dummy gate, removing the sacrificial layer from the fin structure portion using an isotropic etch selective to the sacrificial semiconductor material to form a cavity between an upper surface of the channel layer and a lower surface of the dummy layer, and subsequently depositing the gate dielectric layer.

Removing the sacrificial layer between the channel and dummy layer prior to depositing the gate dielectric can allow the gate dielectric to be deposited on the upper surface of the channel layer. This applies correspondingly to the gate electrode material, and a gate work function metal which may be deposited on the gate dielectric as set out above. Thereby the upper gate electrode portion may be formed also along the upper surface of the channel layer.

The method may further comprise, prior to forming the second spacer layer, forming recesses in the fin structure portion, between the channel layer and the dummy layer, by laterally etching back end surfaces of the sacrificial layer exposed at either side of the dummy gate, wherein the second spacer layer subsequently may be formed to further fill the recesses in the fin structure portion.

The portions of the second spacer layer filling the recesses in the fin structure portion may accordingly define so-called "inner spacers" on the end surfaces of the sacrificial layer. The inner spacer portions of the second spacer layer may (like the other portions of the second spacer layer) laterally confine the isotropic etching to the gate trench, and thus mask the source/drain regions from the isotropic etching process. The inner spacers may further facilitate a subsequent channel release step by masking the source/drain regions from the etching during sacrificial layer removal. The inner spacers may further provide physical and electrical separation between the source/drain regions and the top gate electrode in the final device.

As the first spacer layer is removed prior to forming the second spacer layer, the second spacer layer may be formed to also on the side surfaces of the dummy gate.

Forming the first spacer layer may comprise conformally depositing first spacer material and subsequently etching back the deposited first spacer material along the top-down direction such that portions of the deposited first spacer material remain to form the first spacer layer.

In other words, the portions of the deposited first spacer material on horizontally surfaces may be removed and portions of the deposited first spacer material on vertically oriented surfaces (e.g. the side surfaces of the dummy gate) may remain to form the first spacer layer. The first spacer material may hereby refer to one or more first spacer materials, such that at least one first spacer material may be conformally deposited and etched back to form the first spacer layer.

Forming the second spacer layer may comprise conformally depositing second spacer material and subsequently etching back the deposited second spacer material such that portions of the deposited second spacer material on horizontally oriented surfaces are removed and portions of the deposited second spacer material on vertically oriented surfaces remain to form the second spacer layer. The second spacer material may hereby refer to one or more second spacer materials, such that at least one second spacer material may be conformally deposited and etched back to form the second spacer layer.

The method may further comprise, subsequent to depositing the second spacer material, forming a block mask on either side of the dummy gate, each block mask being formed with a thickness such that the portion of the second spacer material deposited in the recesses underneath the fin structure portion is covered, wherein the block mask masks the portion of the second spacer material in the recesses underneath the fin structure portion such that the portion of the second spacer material therein is preserved to define a portion of the second spacer layer therein.

This facilitates preserving the second spacer material in the recesses underneath the fin structure portion regardless of a thickness of the bonding layer.

The method may further comprise forming an etch stop layer on the bottom FET device, wherein the bonding layer subsequently is formed on the etch stop layer. Forming the lower gate cavity portion may further comprise removing a portion of the etch stop layer overlying the bottom gate electrode. An etch stop layer may mask the layers and structures of the bottom FET device during the formation of the top FET device. The etch stop layer may, e.g., be formed of a metal oxide.

BRIEF DESCRIPTION OF THE DRAWINGS

The above, as well as additional objects, features, and benefits, may be better understood through the following illustrative and non-limiting detailed description, with reference to the appended drawings. In the drawings like reference numerals will be used for like elements unless stated otherwise.

FIG. 1 illustrates a preliminary or intermediate device structure 10 of the stacked FET device to be formed, which after further processing may be processed into a final functional stacked FET device. The final functional FET device may be a complementary FET device, i.e. the FET device may comprise a top FET of a first conductive type and a bottom FET of a second opposite conductive type, e.g. the top FET is a p-type FET and bottom FET is an n-type FET, or vice versa.

FIG. 2 illustrates a bonding layer 202 has been formed over the bottom FET device 100, an etch stop layer 130 has been formed on top of the bottom FET device 100, wherein the bonding layer 202 is formed on top of the etch stop layer 130. A fin structure 204 has also been formed on the bonding layer 202. A longitudinal dimension of the fin structure 204 is oriented along the X-direction. The fin structure 204 comprises a number of channel layers 206.

FIG. 3 illustrates the bonding layer 202 etched through top-down to form a bonding layer pattern 202' while using the fin structure 204 and the dummy gate 212 (with the capping layer 214) as an etch mask. The etching may as shown extend completely through the bonding layer 202 and be stopped on the etch stop layer 130 (or on an upper surface of the bottom FET device 100 if an etch stop layer is omitted).

FIG. 4 illustrates a schematic top-down view of the resulting bonding layer pattern 202'. The bonding layer pattern 202' may also be referred to as "the once patterned bonding layer". The bonding layer pattern 202' comprises a first pattern portion 202a of the dielectric bonding material preserved underneath the fin structure 204, and a second pattern portion 202b of the dielectric bonding material preserved underneath the dummy gate 212.

FIG. 5 illustrates a first spacer layer 216 formed on side surfaces of the dummy gate 212. As the bonding layer 202 has been etched prior to forming the spacer layer 216, the first spacer layer 216 may further be formed on side surfaces of the bonding layer pattern 202', e.g. side surfaces of the first pattern portion 202a and side surfaces of the second pattern portion 202b. The first spacer layer 216 may additional be formed on portions of the side surfaces of the fin structure 204 not covered by the dummy gate 212. The portion of the first spacer layer 216 formed on the side surfaces of the dummy gate 212 may be referred to as a dummy gate spacer.

FIG. 6 illustrates cuts formed in the fin structure 204 and in the bonding layer pattern 202', by first etching through the fin structure 204 and then the bonding layer pattern 202' while using the dummy gate 212 and the first spacer layer 216 thereon as an etch mask. As shown, the fin structure portion 204a and the bonding layer pattern portion 202c are located directly above the bottom gate electrode 112.

FIG. 7 provides a schematic top-down view of the remaining portion of the bonding layer pattern 202". The bonding layer pattern 202" may also be referred to as "the twice patterned bonding layer". The bonding layer pattern 202" comprises the second pattern portion 202b, still preserved underneath the dummy gate 212. However, (sub-) portions of the first pattern portion 202a exposed by the cuts in the fin structure 204 have been removed. Reference sign 202c thus denotes the (sub-)portion of the bonding layer pattern 202" directly underneath/overlapped by the fin structure portion 204a. FIG. 7 additionally shows the portions of the first spacer layer 216 formed on the side surfaces of the bonding layer pattern 202".

FIG. 8 illustrates recesses 218 formed underneath the fin structure portion 204a by laterally etching back side surface portions of the bonding layer pattern portion 202 0c at either side of the dummy gate 212. The recesses 218 may be formed by etching the bonding layer pattern portion 212c using an isotropic etching process. The "side surface portions" of the bonding layer pattern portion 202c refer to the portions of the side surfaces of the bonding layer pattern 202" directly underneath the fin structure portion 204a, i.e. the portions which are exposed (i.e. not covered by) by the first spacer layer 216 (c.f. FIG. 7).

FIG. 9 illustrates recesses 220 formed in the fin structure portion 204a, above and/or below the channel layers 206 and the dummy layer 210, by laterally etching back (e.g. along the X- and negative X-direction) end surfaces of the sacrificial layers 208 exposed at either side of the dummy gate 212.

FIG. 10 illustrates removal of the first spacer layer 216, e.g. from the dummy gate 212 and the side surfaces of the bonding layer pattern 202". Subsequently, second spacer material 222' has been conformally deposited to fill the recesses 218 and 220 and cover the side surfaces of the dummy gate 212 and the capping 214.

FIG. 11 illustrates the second spacer material(s) etched back such that end surfaces of the channel layers 206 are exposed and portions of the second spacer material 222' remain in the recesses 218 and 220, and on the side surfaces of the dummy gate 212. The portions of the second spacer layer 222 on the side surfaces of the dummy gate 212 may be referred to as a gate spacer 222a. The portions of the second spacer layer 222 in the recesses 220 may be referred to as inner spacers 222b. The portions of the second spacer layer 222 in the recesses 218 may be referred to as lower spacers 222c.

FIG. 12 illustrates source and drain bodies 224, 226 formed on the channel layers 206. The source and drain bodies 224, 226 have been formed by epitaxially growing semiconductor material on the end surfaces of the channel layers exposed at opposite sides of the dummy gate 212. The source and drain bodies 224, 226 may as shown subsequently be covered by a dielectric cover material 228.

FIG. 13 illustrates an upper gate cavity portion 230 formed by removing the dummy gate 212 between the opposite gate spacers 222a. As shown, the upper gate cavity portion 230 exposes the fin structure portion 204a and an upper surface of the bonding layer pattern 202', more specifically an upper surface of the first part 202a of the bonding layer pattern 202'.

FIG. 14 illustrates a lower gate cavity portion 232 formed by removing the bonding layer pattern portion 202c and the first part 202a of the bonding layer pattern 202'. The second spacer layer 222 may thus act as an etch mask, laterally confining to the upper and lower gate cavity portions 230, 232, and thus masking the dielectric cover material 228 in the source/drain regions from the isotropic etching process.

FIG. 15 illustrates sacrificial layers 208 removed from the fin structure portion 204a using an isotropic etch selective to the sacrificial semiconductor material. By removing the sacrificial layers 208, the channel layers 206 may be released in the sense that upper and lower surfaces thereof may be exposed within the upper gate cavity portion 230. In particular, a cavity may as shown be formed between an upper surface of the top-most channel layer 206 and a lower surface of the dummy layer 210.

FIG. 16 illustrates a gate dielectric layer 234 and then a (first) work function metal (WFM) layer 236 have been conformally deposited in the upper and lower gate cavity portions 230, 232. The deposition of the WFM layer 236 represents an initial step of forming a gate electrode in the upper and lower gate cavity portions 230, 232. Owing to the conformal deposition, the layers 234 and 236 may surround the channel layers 206 and the dummy layer 210. The gate dielectric layer 234 and the WFM layer 236 may further be deposited on a bottom surface of the lower gate cavity portion 232, e.g. on the etch stop layer 130.

FIG. 17 illustrates the WFM layer 236 and subsequently the gate dielectric layer 234 have each been opened using a top-down anisotropic etch. After opening the gate dielectric layer 234. the etch stop layer 130 may also be opened (e.g. by a top-down anisotropic etch). An upper surface of the bottom gate electrode 112, which in the illustrated embodiment is defined by the gate fill layer 116, is thus exposed in the lower gate cavity portion 232. This completes the formation of the lower gate cavity portion 232. During the etching, the fin structure portion 204a may mask/shadow a portion of the of the WFM layer 236 such that a respective portion of the WFM layer 236, the gate dielectric layer 234 and the etch stop layer 130 remain on the bottom gate electrode 112. The upper surface of the bottom gate electrode 112 may hence be exposed on opposite sides of the fin structure portion 204a, as viewed along a direction transverse to the channel layers 206 (e.g. along the Y-direction).

FIG. 18 illustrates one or more further gate electrode materials, commonly referenced 238, have been deposited to fill a remaining space in the lower and upper gate cavity portions 230, 232. The gate electrode material(s) may together with the remaining portions of the work function metal 236 define a top gate electrode 240, comprising an upper gate electrode portion 240a in the upper gate cavity portion 230, and a lower gate electrode portion 240b in the lower gate cavity portion 232. The upper gate electrode portion 240a extends along and surrounds the channel layers 204 and the dummy layer 210. The lower gate electrode portion 240b is arranged in direct physical and electrical contact with the upper surface of the bottom gate electrode 112.

FIG. 19 illustrates that alternative embodiment is similar to the illustrated embodiment described above, however differs in that the bottom gate electrode 112 is provided with a dielectric cap 1116. The dielectric cap 1116 may for example be formed by recessing the bottom gate electrode 112 top-down and filling the space created by the recess with a dielectric capping material. The etch stop layer 130 (if present) and the bonding layer 202 may subsequently be formed on top of the dielectric cap 1116. The method may then proceed as outlined above, with the difference that the forming of the lower gate cavity portion 232 further may comprise opening (i.e. etching through) the cap 1116, to expose an upper surface of the bottom gate electrode 112, as shown in FIG. 19. During the opening of the cap 1116 the dummy layer 210 may serve a similar masking function for the channel layers 206, as described above. The dummy layer 210 may beneficially be formed of a different material than the capping 1116. A portion of the dielectric cap 1116, shadowed by the fin structure portion 204a during the opening of the cap 1116, may remain on the bottom gate electrode 112.

FIG. 20 illustrates the resulting device 20 subsequent to filling the upper and lower gate cavity portions 230, 232 with gate electrode material 238. As shown, the lower gate electrode portion 240b may thus extend past the remaining portion of the dielectric cap 1116, on either side thereof as viewed along the Y-direction.

DETAILED DESCRIPTION OF THE PRESENT DISCLOSURE

The present disclosure will now be described more fully hereinafter with reference to the accompanying drawings, in which embodiments are shown. The present disclosure may, however, be implemented in many different forms and should not be construed as limited to the variants set forth herein; rather, these variants are provided for thoroughness and completeness, and fully convey the scope of the present disclosure to the ordinary skilled person.

An embodiment of a method for forming a stacked field-effect transistor (FET) device will now be described with reference to FIGS. 1 to 18. It is to be noted that the relative sizes of the different layers may not be representative to a physical realization of a stacked FET device. For example, some structures and layers may have been exaggerated herein for illustrative purposes.

In the figures, the X-axis and the Y-axis indicate a first and a second horizontal direction, respectively. The X-axis and Y-axis are parallel to a main plane extension of a substrate 12 (shown in the first cross-sectional view of FIG. 1) on which the top and bottom FET devices 100, 200 are formed. The X-axis is parallel to a channel direction of the top and bottom FET devices. The Y-axis is transverse to the X-axis. The Z-axis indicates a vertical or bottom-up direction (normal to the substrate 12). Terms such as "top" and "bottom" as used herein thus relate to the Z-axis.

Each figure (FIGS. 4 and 7 excepted) comprises three different views of the FET device 10, wherein the first view (left) is a cross section along the plane A-A' indicated in the third (right) view. The second (center) view is a cross section along the plane B-B' indicated in the third view. The third view is a cross section along the plane C-C' indicated in the first and second view. In the figures, different layers (e.g. of different materials) are represented by different pattern fills. Conversely layers of a same material are represented by a same pattern fill.

Figure 1:
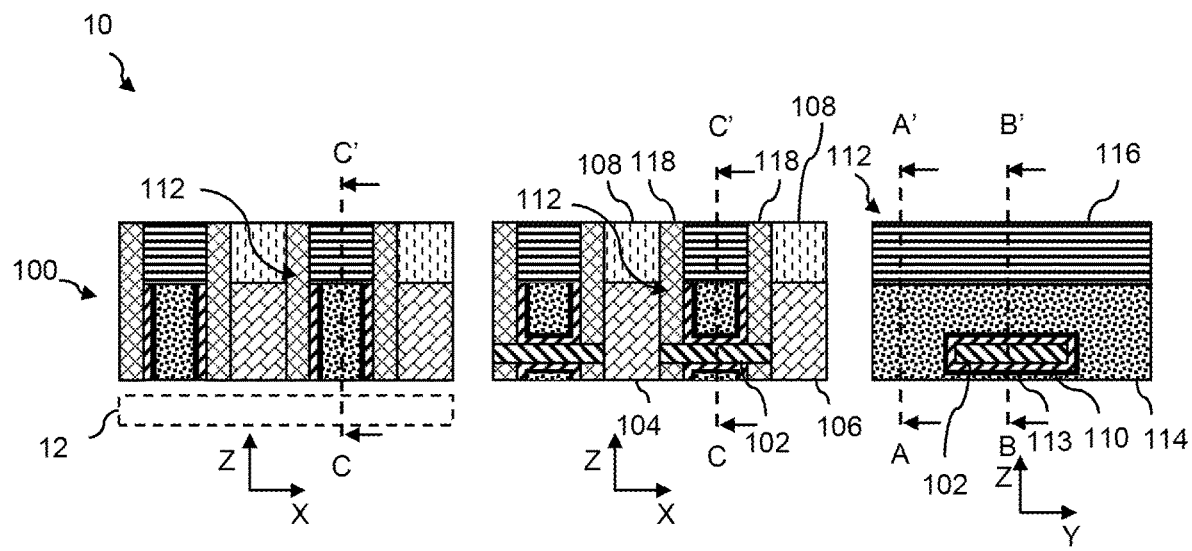
FIGS. 1-18 illustrate a method for forming a stacked field-effect transistor device, according to an embodiment.

FIG. 1, left view, shows a preliminary or intermediate device structure 10 of the stacked FET device to be formed, which after further processing may be processed into a final functional stacked FET device. The final functional FET device may be a complementary FET device, i.e. the FET device may comprise a top FET of a first conductive type and a bottom FET of a second opposite conductive type, e.g. the top FET is a p-type FET and bottom FET is an n-type FET, or vice versa.

The bottom FET device level comprises a bottom FET device 100. The bottom FET device 100 may be any conventional FET suitable as a bottom FET device in a stacked FET device, in particular a complementary FET. The bottom FET device 100 illustrated herein shows one bottom channel layer 102. The bottom channel layer 102 may however be part of a bottom device layer structure comprising two or more channel layers (not shown). The bottom FET device 100 further comprises a source region 104 and a drain region 106. The source and drain regions 104, 106 are merely schematically indicated but may comprise source and drain bodies epitaxially grown on respective ends of the channel layer(s) 102. The source and drain regions 104, 106 may further comprise source/drain electrodes for forming source and drain contacts. The source/drain electrodes may be of any conventional metal typically used as source/drain electrode material. Example metals include W, Al, Ru, Mo or Co. The source/drain regions 104, 106 may as shown be covered with a dielectric layer 108, for example of an oxide such as $SiO_2$ or another conventional (low-k) inter-layer dielectric material.

The bottom FET device 100 further comprises a gate dielectric layer 110 (e.g. of a high-k dielectric, such as $HfO_2$, LaO, AlO and ZrO) deposited on the bottom channel layer 102. Along the bottom channel layer 102, and on the gate dielectric layer 110, a bottom gate electrode 112 is arranged. The bottom gate electrode 112 may extend across the bottom channel layer 102. The gate dielectric layer 110 and the bottom gate electrode 118 may as shown form a gate-all-around, i.e. surround the bottom channel layer 102 on all sides.

The bottom gate electrode 112 may comprise gate electrode material comprising one or more metals, such as work function metal and fill metal. According to the illustrated example, the bottom gate electrode 112 comprises a work function metal layer 113. The work function metal layer 113 may be provided on the gate dielectric layer 110. The bottom gate electrode 112 may as shown optionally comprise one or more additional work function metal layers, commonly referenced 114, provided on the (first) work function metal layer 113. The bottom gate electrode 112 may as shown further comprise one or more gate fill metals, commonly referenced 116.

As mentioned above, the bottom FET device 100 may be formed on a substrate 12. Because the bottom FET device 100 may comprise additional layers not shown herein, the substrate 12 is merely schematically illustrated at a distance from a bottom of the bottom device FET 100. The substrate 128 may be a conventional semiconductor substrate suitable for complementary FETs. The substrate 128 may be a single-layered semiconductor substrate, for instance formed by a bulk substrate such as a Si substrate, a germanium (Ge) substrate or a silicon-germanium (SiGe) substrate. A multi-layered/composite substrate is however also possible, such as an epitaxially grown semiconductor layer on a bulk substrate, or a semiconductor-on-insulator (SOI) substrate, such as a Si-on-insulator substrate, a Ge-on-insulator substrate, or a SiGe-on-insulator substrate. The substrate 12 is omitted from subsequent figures for illustrational clarity.

As shown in FIG. 1, the bottom FET device level may comprise a number of bottom FET devices in series (e.g. two or more). A corresponding number of top FET devices may be formed in the top FET device level. The following the method will be described with reference to the one bottom FET device and one top FET device. However, any further bottom and top FET devices may be processed correspondingly.

Figure 2:
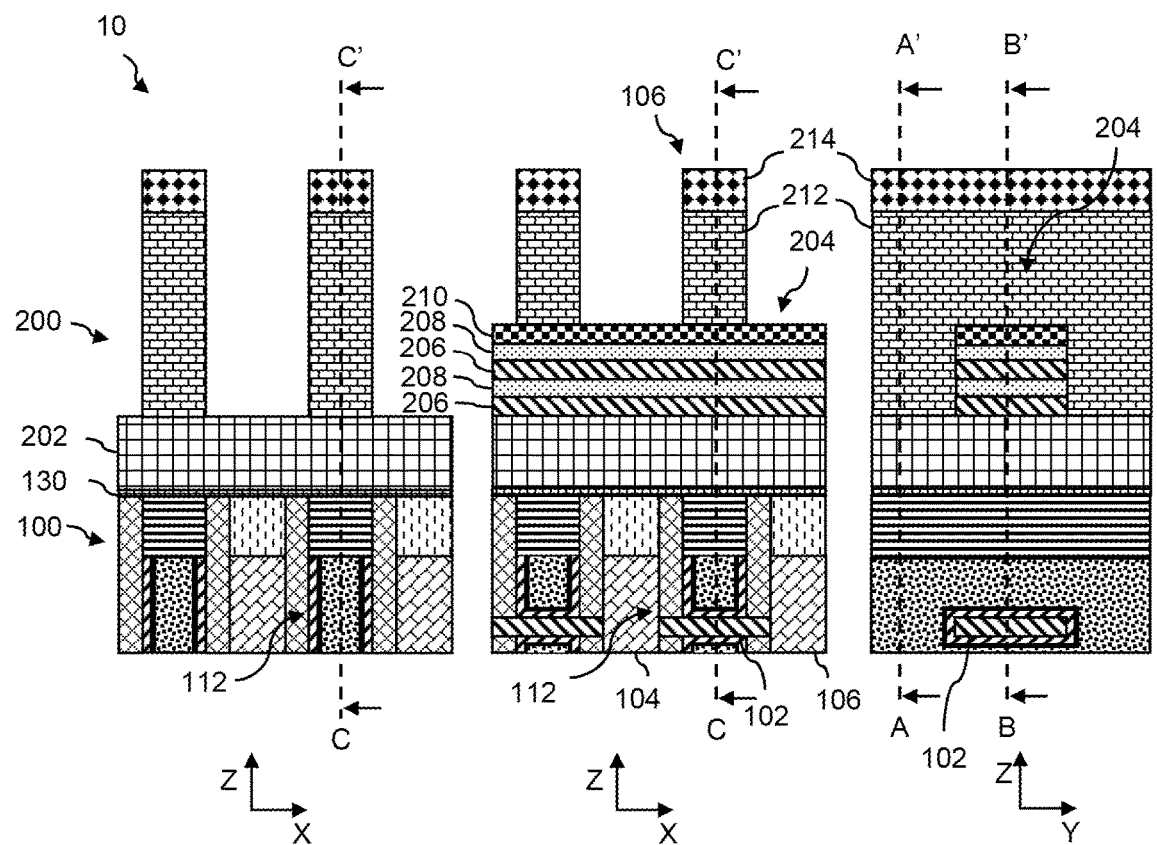

In FIG. 2, a bonding layer 202 has been formed over the bottom FET device 100. In the following description it will be assumed that the bonding layer 202 is formed by a single layer of a single dielectric bonding material. However, the bonding layer 202 may more generally be a composite layer structure of two or more different dielectric bonding materials. The bonding layer 112 may be formed by one or more layers of an insulating material e.g. oxides, such as silicon oxide ($SiO_2$) or nitrides such as silicon nitride (SiN) or SiC N.

In FIG. 2, an etch stop layer 130 has been formed on top of the bottom FET device 100, wherein the bonding layer 202 is formed on top of the etch stop layer 130. However, an etch stop layer may in other embodiments be omitted wherein the bonding layer 202 may be formed on top of the bottom FET device 100, i.e. directly on an upper surface of the bottom FET device 100. The etch stop layer 130 may, for example, be formed of a metal oxide such as $Al_2O_3$.

A fin structure 204 has been formed on the bonding layer 202. A longitudinal dimension of the fin structure 204 is oriented along the X-direction. The fin structure 204 comprises a number of channel layers 206. The channel layers 206 may be made of a same channel semiconductor material (hereinafter denoted "channel material"). The fin structure 204 further comprises a number of sacrificial layers 208 arranged alternatingly with the channel layers 206. The sacrificial layers 208 may be formed of a sacrificial semiconductor material, different from the channel material.

The number of channel layers 206 and sacrificial layers 208 shown in FIG. 2 are merely an example. The fin structure 204 may comprise a smaller or greater number of channel layers and sacrificial layers, depending e.g. on the number of channel layers desired in the finished device and the type of gate (e.g. gate-all-around or tri-gate).

As shown, the fin structure 204 may further comprise a top-most layer 210 of a dielectric material. According to the illustrated embodiment, the layer 210 may be preserved and used as an etch mask at various stages of the method, and remain as a "dummy channel" in the finished top FET device. The layer 210 and the material thereof may, accordingly in the following, be denoted "dummy layer 210" and dummy dielectric material. Examples of dummy dielectric material include hard mask materials e.g. an oxide, a nitride, a carbide, such as SiN, SiC, SiCO, SiCN or SiBCN. The dummy layer 210 may as shown form a form a topmost layer of the fin structure 204.

The fin structure 204 may be formed by patterning an initial device layer structure comprising the channel layer(s) and the sacrificial layer(s). The layers of the initial device layer structure may be formed as epitaxial layers, e.g. epitaxially grown using deposition techniques which per se are known, such as chemical vapor deposition (CVD) or physical vapor deposition (PVD). The initial device layer structure may, for example, be formed on a donor wafer, transferred to the bonding layer 202, and subsequently be patterned to define the fin structure. The bonding may comprise conventional pre-bonding sub-steps such as plasma treatment, rinsing and alignment, as well as post-bonding steps such as activation anneal. The initial device layer structure may be patterned using conventional fin patterning techniques, e.g. single patterning techniques such as lithography and etching ("litho-etch") or multiple-patterning techniques such as (litho-etch)$^x$, self-aligned double or quadruple patterning (SADP or SAQP). In particular, the patterning may comprise forming a fin patterning mask of the dummy dielectric material and subsequently etching the initial device layer structure using the fin patterning mask as an etch mask. The patterned dummy dielectric material of the fin patterning mask may be preserved to form the dummy layer 210 of the resulting fin structure 204.

The channel layers 206 and the sacrificial layers 208 may each be Si-comprising layers, wherein the different layers have different Ge-contents. For example, the channel layers 206 may be Si-layers and the sacrificial layers 208 may be SiGe-layers. As an example, the sacrificial layers 208 may be layers of $Si_{1-y}Ge_y$, and the channel layers may be layers of $Si_{1-x}Ge_x$, wherein $0 \leq x < y$, wherein $y \geq x + 0.25$.

In general, the channel layers 206 and the sacrificial layers 208 may be formed as nanosheets, i.e. nanosheet-shaped layers, thereby allowing forming of nanosheet-based FETs. A nanosheet may, by way of example, have a width (i.e. along the Y-direction) in ranging from 10 nm to 30 nm and a thickness (i.e. along the Z-direction) in ranging from 3 nm to 10 nm, or less. As shown, the channel layers 206 may be formed with equal or at least similar thickness. The sacrificial layers 208 may also be formed with equal or at least similar thickness, e.g. equal to or a similar thickness to the channel layers 206.

As further shown in FIG. 2, a dummy gate 212 has been formed to extend across the fin structure 204 along the Y-direction. The dummy gate 212 may form a place holder for a final functional gate structure to be formed at a later stage.

To facilitate the gate-to-gate contact between a top gate electrode of the final top FET device and the bottom gate electrode 112 of the bottom FET device 100, the dummy gate 212 may be formed at a location directly above the bottom gate electrode 112, such that the dummy gate 212 overlaps the bottom gate electrode 112, as viewed along the bottom-up/vertical direction (e.g. the Z-direction). The dummy gate 212 may be formed in a manner which per se is known in the art, e.g. by patterning a layer of a dummy gate material (e.g. amorphous silicon) using a suitable single- or multi-patterning technique.

The dummy gate 212 may as shown further be provided with a capping layer 214 of a hard mask material, remaining from a preceding dummy gate patterning step.

Figure 3:
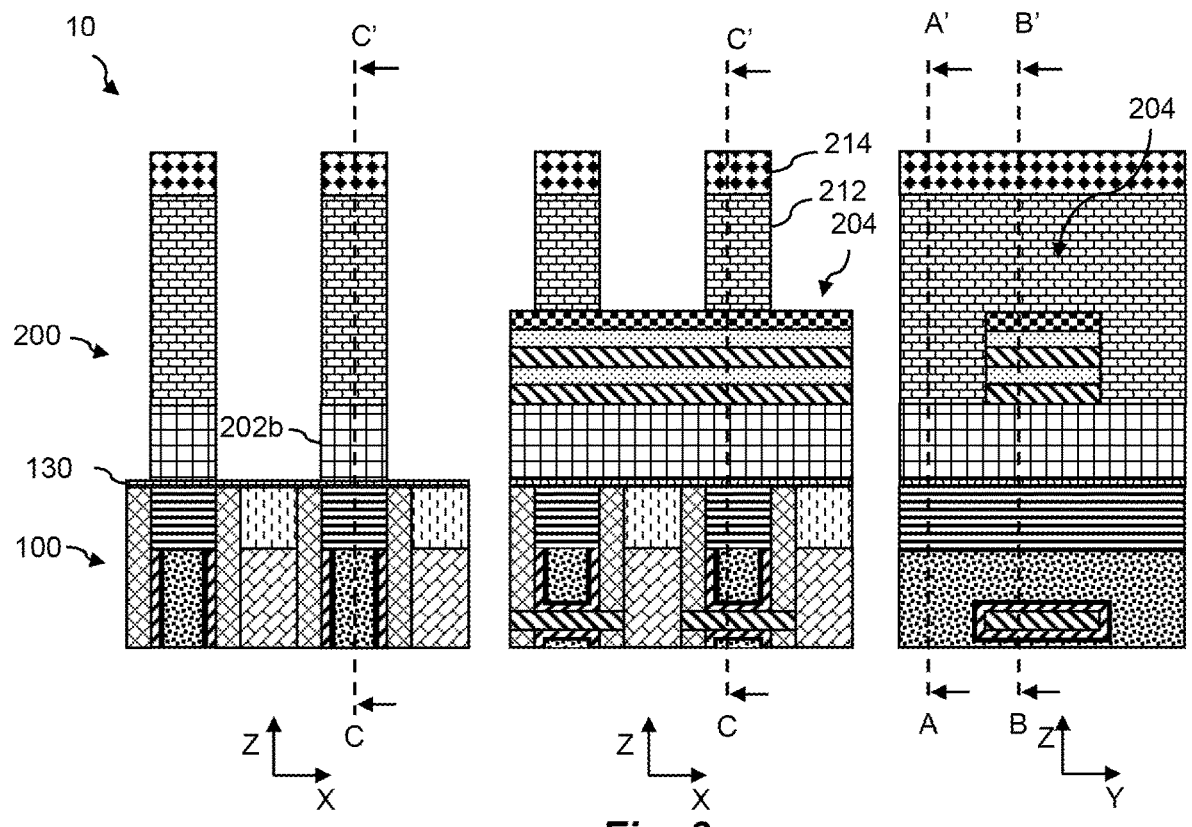
Figure 4:
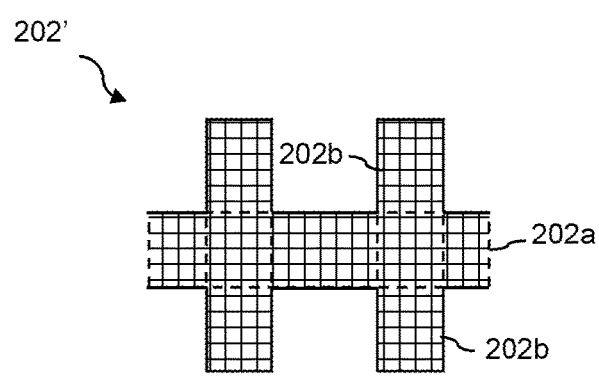

In FIG. 3, the bonding layer 202 has been etched through top-down to form a bonding layer pattern 202' while using the fin structure 204 and the dummy gate 212 (with the capping layer 214) as an etch mask. The etching may as shown extend completely through the bonding layer 202 and be stopped on the etch stop layer 130 (or on an upper surface of the bottom FET device 100 if an etch stop layer is omitted). Any etching process (isotropic or anisotropic, wet or dry) suitable for etching the dielectric bonding material may be used. FIG. 4 provides a schematic top-down view of the resulting bonding layer pattern 202'. The bonding layer pattern 202' may also be referred to as "the once patterned bonding layer". The bonding layer pattern 202' comprises a first pattern portion 202a of the dielectric bonding material preserved underneath the fin structure 204, and a second pattern portion 202b of the dielectric bonding material preserved underneath the dummy gate 212.

As may be understood from FIGS. 3 and 4, the bonding layer pattern 202' may comprise a portion which is common to the first and second pattern portions 202a, 202b, i.e. a portion of the dielectric bonding material masked by both the fin structure 204 and the dummy gate 212, i.e. where the dummy gate 212 overlaps the fin structure 204. As indicated in FIG. 4, corresponding second pattern portions of the bonding layer pattern 202' may be preserved underneath each further dummy gate.

Figure 5:
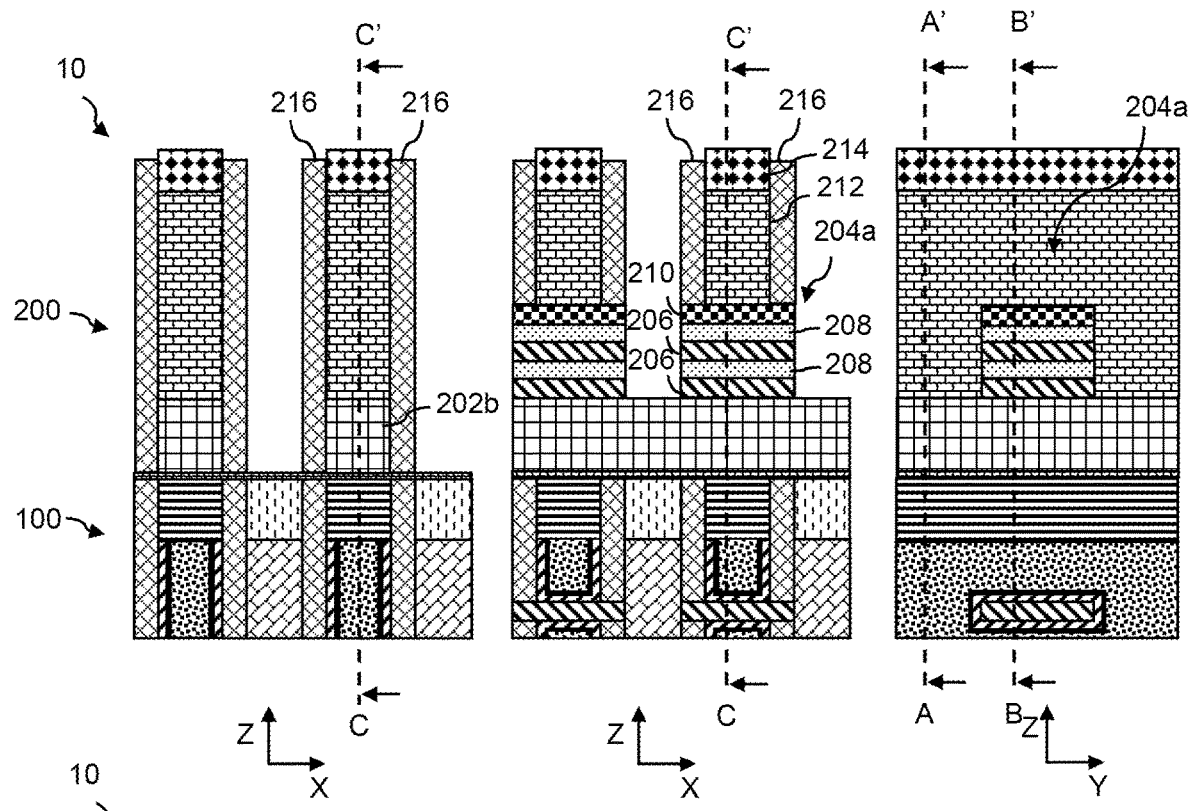

In FIG. 5 a first spacer layer 216 has been formed on side surfaces of the dummy gate 212. The first spacer layer 216 may be formed by conformally depositing first spacer material and subsequently etching back the deposited first spacer material along the top-down direction (e.g. negative Z direction) such that portions of the deposited first spacer material remain to form the first spacer layer on the side surfaces of the dummy gate 212. An anisotropic dry etching process may be used. As the bonding layer 202 has been etched prior to forming the spacer layer 216, the first spacer layer 216 may further be formed on side surfaces of the bonding layer pattern 202', e.g. side surfaces of the first pattern portion 202a and side surfaces of the second pattern portion 202b. The first spacer layer 216 may additional be formed on portions of the side surfaces of the fin structure 204 not covered by the dummy gate 212. The portion of the first spacer layer 216 formed on the side surfaces of the dummy gate 212 may be referred to as a dummy gate spacer. The first spacer layer 216 may be formed of dielectric material, e.g. as an oxide, a nitride or a carbide such as SiN, SiC, SiCO, SiCN or SiBCN deposited by ALD.

Figure 6:
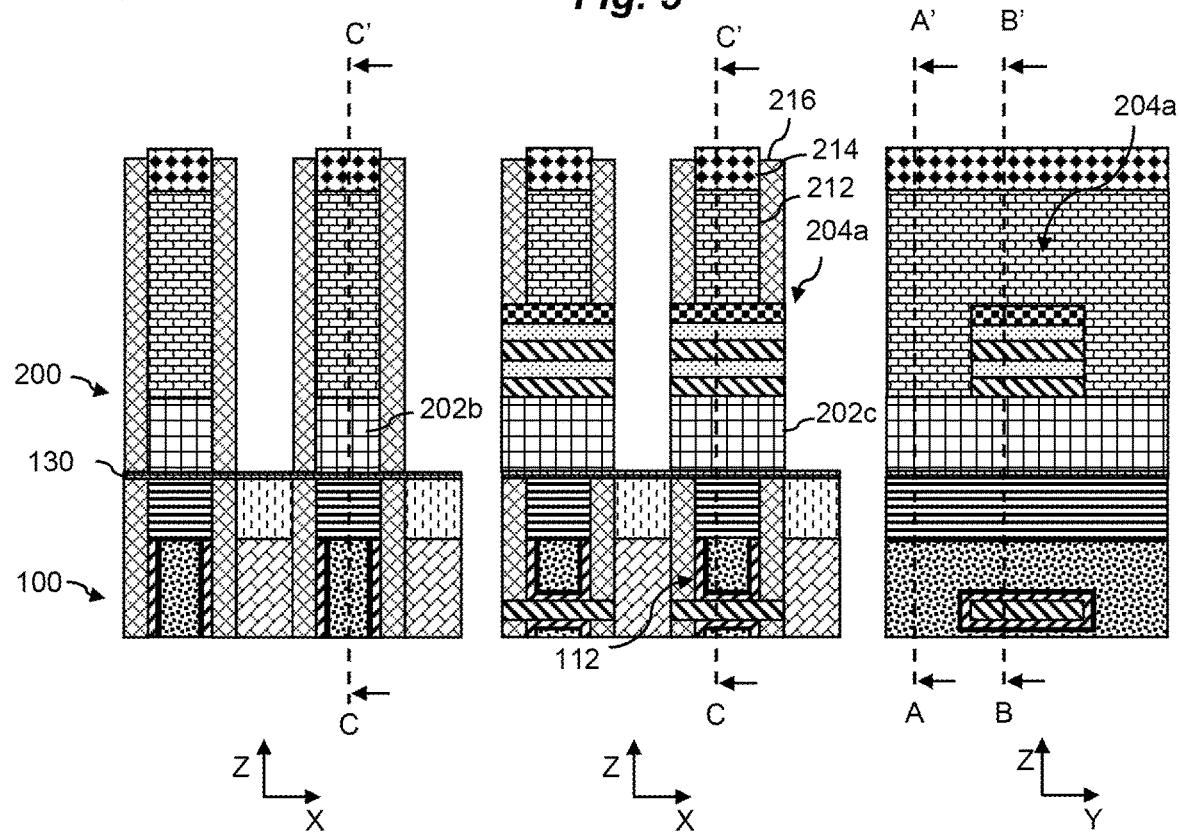
Figure 7:
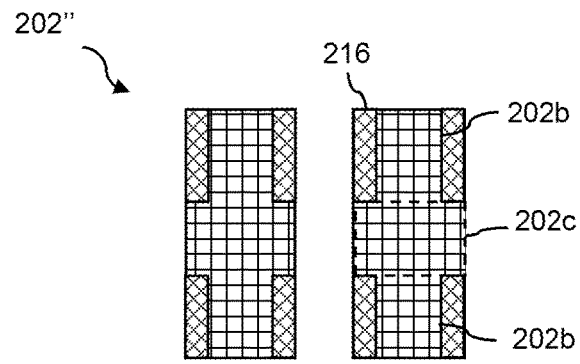

In FIG. 6, cuts have been formed in the fin structure 204 and in the bonding layer pattern 202', by first etching through the fin structure 204 and then the bonding layer pattern 202' while using the dummy gate 212 and the first spacer layer 216 thereon as an etch mask. The cuts may be formed using a top-down anisotropic etch. Different etching processes may be used for etching through the fin structure 204 and subsequently the bonding layer pattern 202'. In particular, different etching processes may be used to etch through the dielectric material dummy layer 210 and the semiconductor channel and sacrificial layers 206, 208. A portion of the fin structure 204 (i.e. "fin structure portion 204a") on a remaining portion of the bonding layer pattern 202', may thus be preserved underneath the dummy gate 212 and the gate spacer/first spacer layer 216 thereon. FIG. 7 provides a schematic top-down view of the remaining portion of the bonding layer pattern 202". The bonding layer pattern 202" may also be referred to as "the twice patterned bonding layer". The bonding layer pattern 202" comprises the second pattern portion 202b, still preserved underneath the dummy gate 212. However, sub-portions of the first pattern portion 202a exposed by the cuts in the fin structure 204 have been removed. Reference sign 202c thus denotes the sub-portion of the bonding layer pattern 202" directly underneath/overlapped by the fin structure portion 204a. As shown in FIG. 6, the fin structure portion 204a and the bonding layer pattern portion 202c are located directly above the bottom gate electrode 112. FIG. 7 additionally shows the portions of the first spacer layer 216 formed on the side surfaces of the bonding layer pattern 202".

Figure 8:
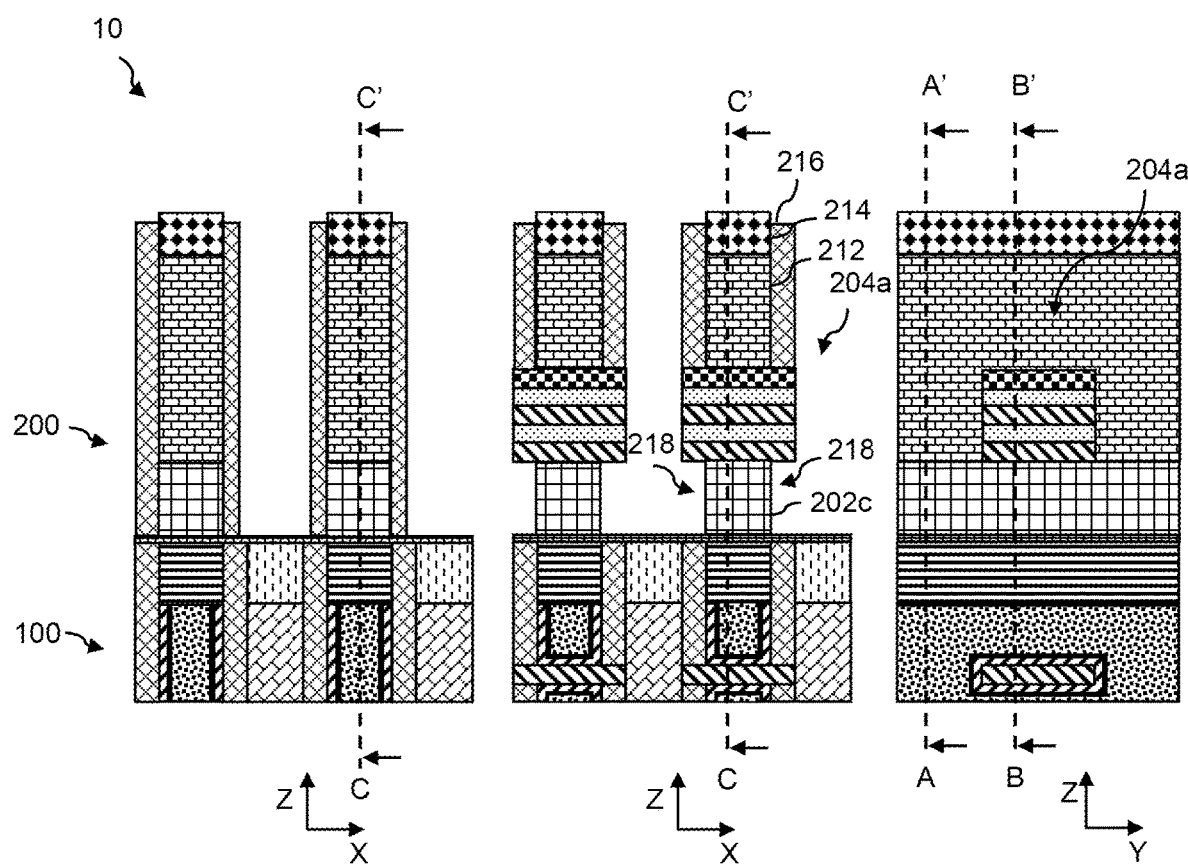

In FIG. 8 recesses 218 have been formed underneath the fin structure portion 204a by laterally etching back side surface portions of the bonding layer pattern portion 2020c at either side of the dummy gate 212. The recesses 218 may be formed by etching the bonding layer pattern portion 212c using an isotropic etching process. The "side surface portions" of the bonding layer pattern portion 202c refer to the portions of the side surfaces of the bonding layer pattern 202" directly underneath the fin structure portion 204a, i.e. the portions which are exposed (i.e. not covered by) by the first spacer layer 216 (c.f. FIG. 7).

Figure 9:
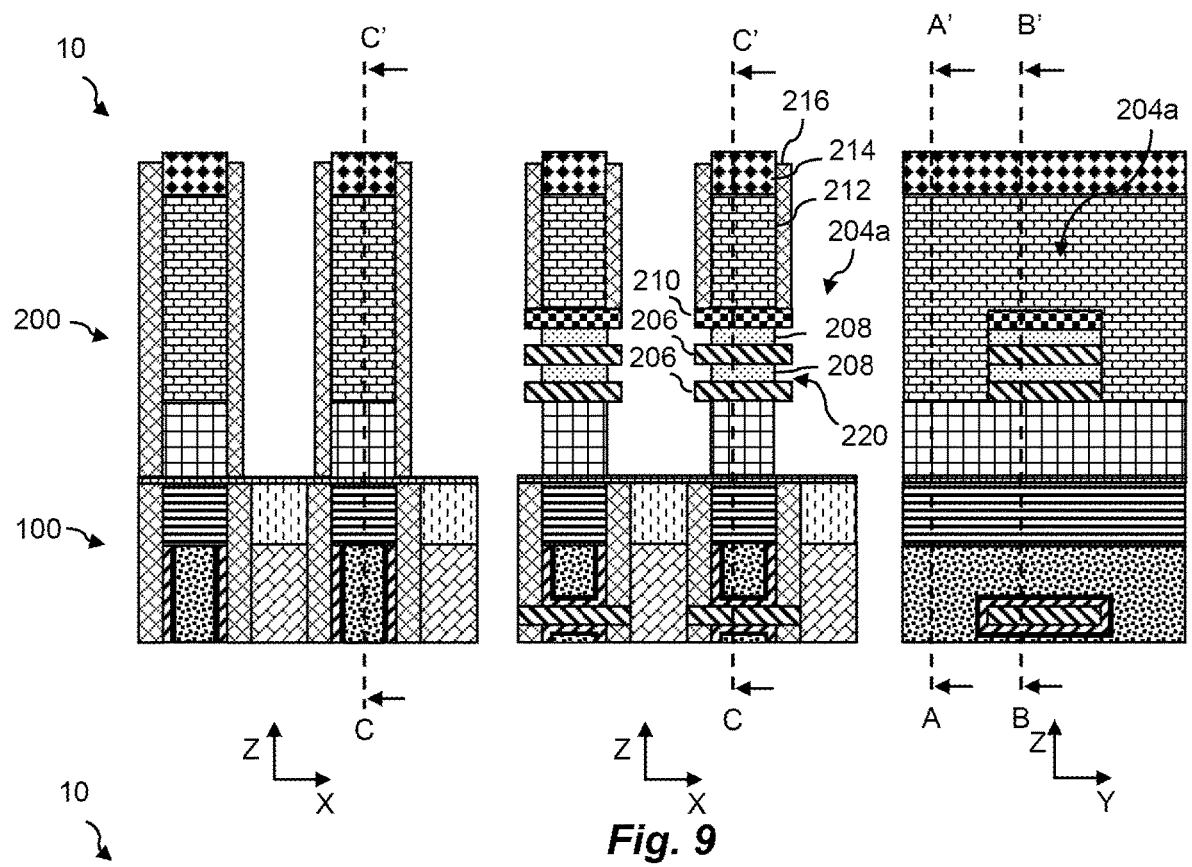

In FIG. 9, recesses 220 have further been formed in the fin structure portion 204a, above and/or below the channel layers 206 and the dummy layer 210, by laterally etching back (e.g. along the X- and negative X-direction) end surfaces of the sacrificial layers 208 exposed at either side of the dummy gate 212. The lateral etch back may be achieved by an isotropic etching process. Any suitable dry etching process or wet etching process allowing selective etching of the sacrificial material may be used (e.g. HCl, or APM).

As indicated in FIGS. 8 and 9, the extent of the lateral etch back of the fin structure portion 204a as well as of the sacrificial layers 208 (i.e. the depth of the recesses 218, 220) may correspond to a thickness of the gate spacer/first spacer layer 216.

Figure 10:
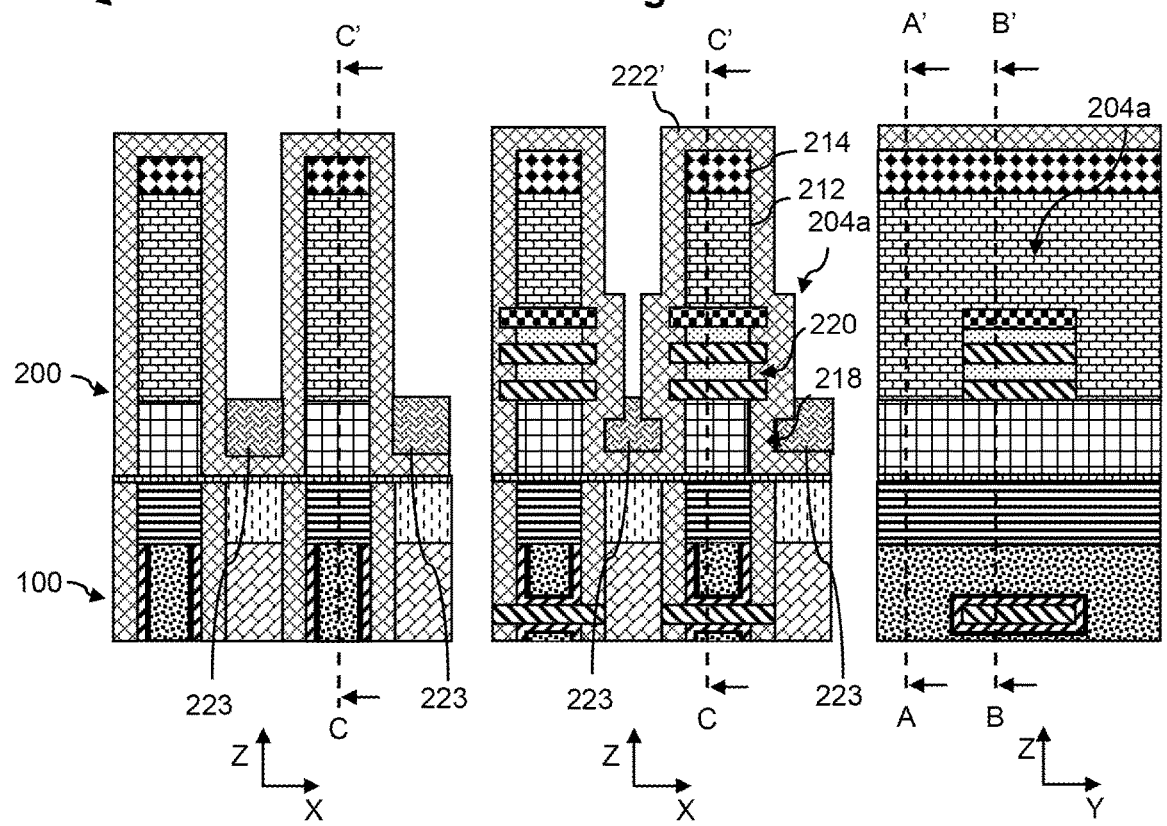
Figure 11:
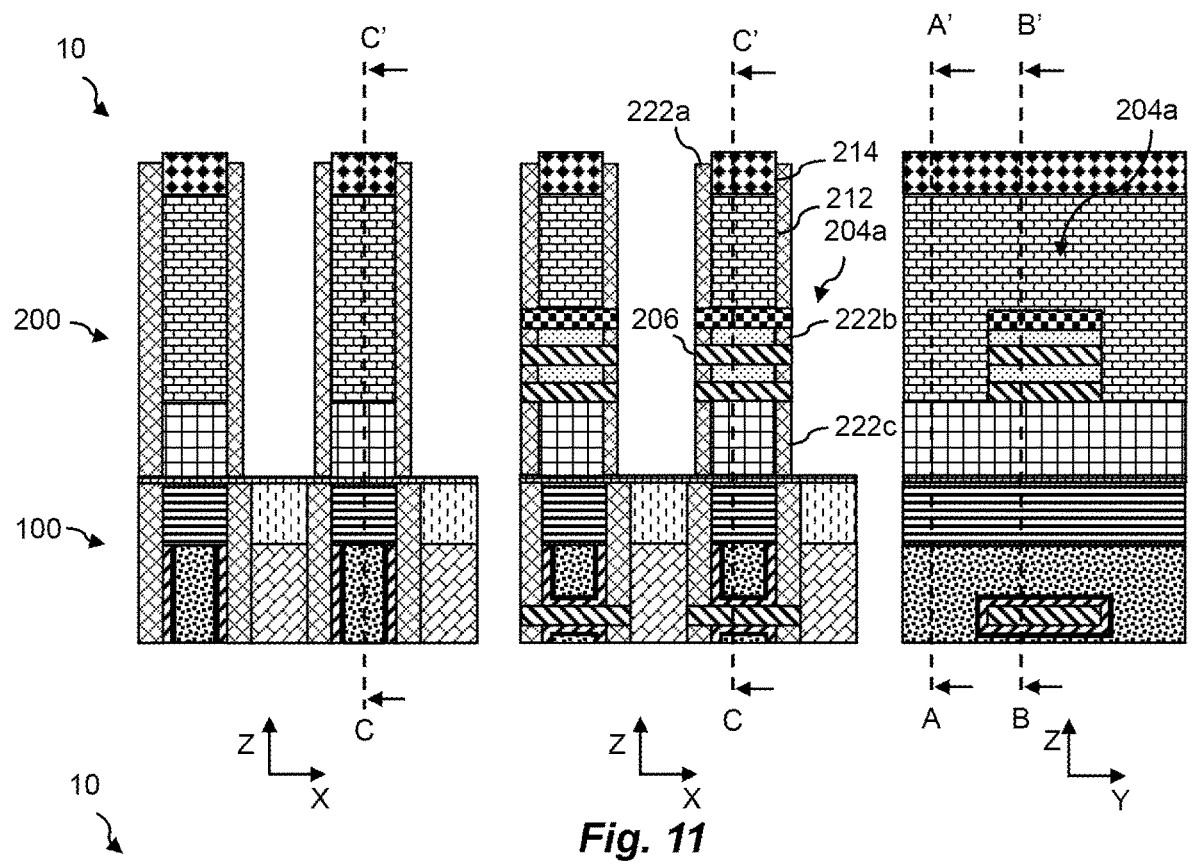

FIGS. 10 and 11 show process steps for forming a second spacer layer 222 filling the recesses 218 underneath the fin structure portion 204a, as well as the recesses 220 in the fin structure portion 204a.

In FIG. 10 the first spacer layer 216 has been removed, e.g. from the dummy gate 212 and the side surfaces of the bonding layer pattern 202". Subsequently, second spacer material 222' has been conformally deposited to fill the recesses 218 and 220 and cover the side surfaces of the dummy gate 212 and the capping 214.

As indicated by the fill pattern, the second spacer material 222' may be a same material as the material of the first spacer layer 216. However, the second spacer material 222' may also be formed of another one of the example materials listed in connection with the first spacer layer 216.

FIG. 10 shows a single second spacer material. However, it is also possible to conformally deposit more than one second spacer material sequentially. For example, an initial second spacer material may first be conformally deposited to partially fill the recesses 220. A subsequent second spacer material may then be deposited on the initial second spacer material to completely fill the recesses 220. The initial spacer material may for example be SiCO and the subsequent spacer material SiN.

In either case, the (one or more) second spacer material(s) 222' may as shown be deposited with a thickness such the recesses 220 are pinched-off. In the illustrated example, a thickness of the bonding layer pattern 202" is such that pinch-off does not occur in the recesses 218. However, if a thickness (along the Z direction) of the bonding layer pattern 202" approaches a thickness of the sacrificial layers 208, pinch-off may occur also in the recesses 218.

In FIG. 11, the second spacer material(s) have been etched back such that end surfaces of the channel layers 206 are exposed and portions of the second spacer material 222' remain in the recesses 218 and 220, and on the side surfaces of the dummy gate 212. The portions of the second spacer layer 222 on the side surfaces of the dummy gate 212 may be referred to as a gate spacer 222a. The portions of the second spacer layer 222 in the recesses 220 may be referred to as inner spacers 222b. The portions of the second spacer layer 222 in the recesses 218 may be referred to as lower spacers 222c.

Any suitable etching process (isotropic or anisotropic, wet or dry) for etching the second spacer material(s) 222' may be used. In either case, the etching may be stopped when end surfaces of the channel layers 206 are exposed.

If employing an anisotropic top-down etch (e.g. along the negative Z-direction), the etch back may result in an etch back (top-down) of the second spacer material 222' by an amount corresponding to a height of the fin structure portion 104a. A thickness (i.e. height) of the capping layer 214 may accordingly be increased such that the etch back does not lay bare the side surfaces of the dummy gate 212.

If employing an isotropic etch, removal of the portions of the second spacer material 222' in the recesses 218 may be counteracted by forming a block mask (elements 223 in FIG. 10) along the bonding layer pattern 202", at opposite sides of the dummy gate 212. The block masks 223 may be formed with a thickness such that a portion of the second spacer material 222' deposited in the recesses 218 is covered. The block masks 223 may thus mask the second spacer material 222' in the recesses 218 during the etch back. The block masks 223 may subsequently be removed. The block masks 223 may be formed by depositing an organic spin-on material (e.g. spin-on-carbon) and subsequently etching back the deposited material to define block masks 223 of a desired thickness.

Figure 12:
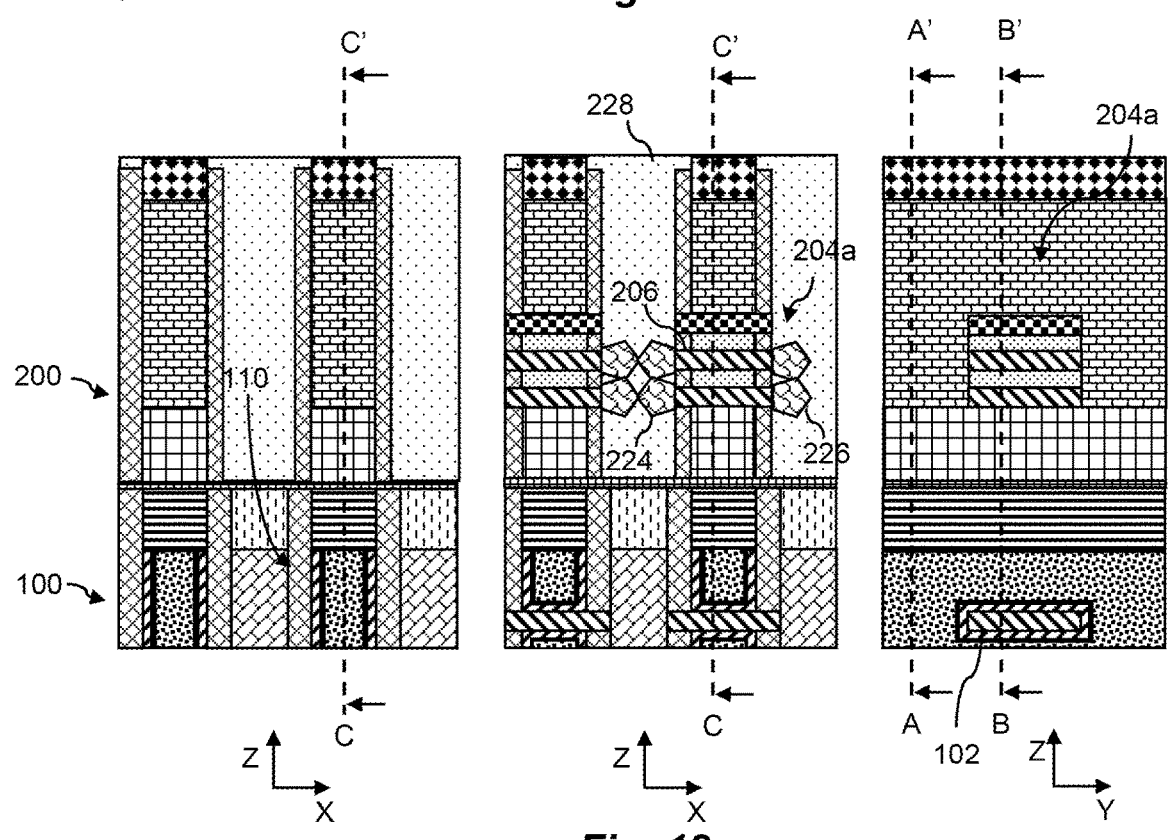

In FIG. 12, source and drain bodies 224, 226 have been formed on the channel layers 206. The source and drain bodies 224, 226 have been formed by epitaxially growing semiconductor material on the end surfaces of the channel layers exposed at opposite sides of the dummy gate 212. The material may be doped to a desired conductivity type. The doping may, for example, be achieved by in-situ doping.

The source and drain bodies 224, 226 may as shown subsequently be covered by a dielectric cover material 228. The dielectric cover material 228 may be an insulating material, such as an oxide, e.g. $SiO_2$, or another inter-layer dielectric, deposited, planarized and recessed, e.g. by chemical mechanical polishing (CMP) and/or etch back. The CMP and/or etch back may proceed to also remove any capping 214 of the sacrificial gate structure 120. However, as shown, it is also possible to stop the CMP and/or etch back on the capping 214 and subsequently open the capping 214 using a separate etch step.

Figure 13:
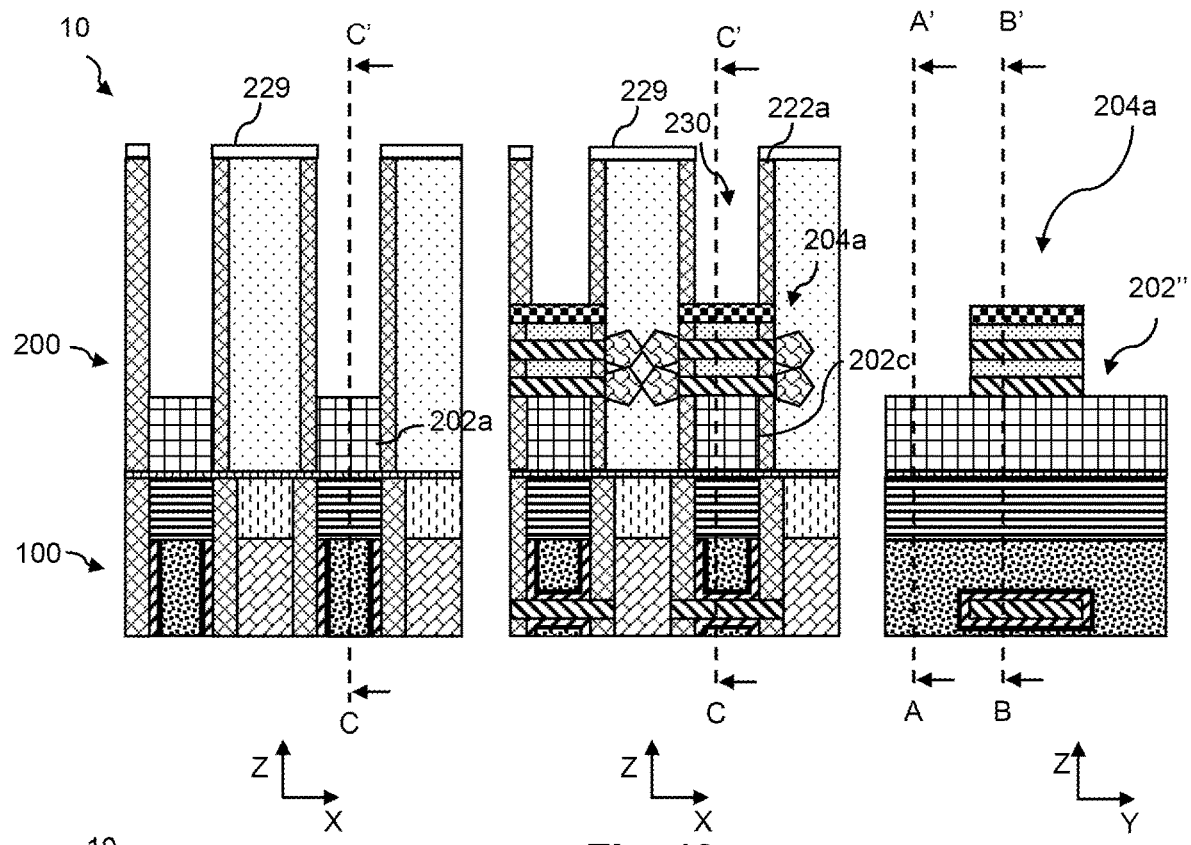

In FIG. 13, an upper gate cavity portion 230 has been formed by removing the dummy gate 212 between the opposite gate spacers 222a. Any conventional suitable etching process (isotropic or anisotropic, wet or dry) allowing selective removal of the dummy gate 212 (e.g. of amorphous Si) may be used. As shown, the upper gate cavity portion 230 exposes the fin structure portion 204a and an upper surface of the bonding layer pattern 202', more specifically an upper surface of the first part 202a of the bonding layer pattern 202'.

Figure 14:
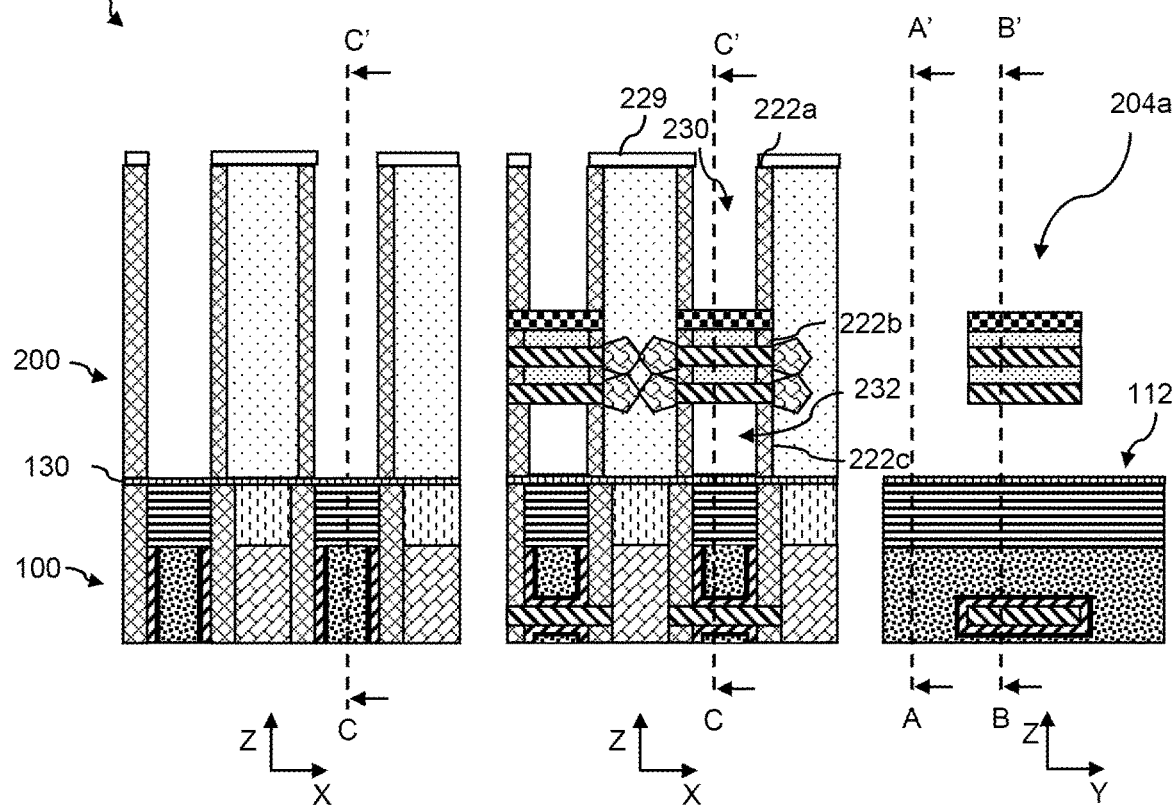

In FIG. 14, a lower gate cavity portion 232 has been formed by removing the bonding layer pattern portion 202c and the first part 202a of the bonding layer pattern 202' using an isotropic etching process selective to the dielectric bonding material. More specifically, the etching process etches the dielectric bonding material selectively to the material of the second spacer layer 222 (e.g. etching $SiO_2$ selectively to SiCO and/or SiN). The second spacer layer 222 may thus act as an etch mask, laterally confining to the upper and lower gate cavity portions 230, 232, and thus masking the dielectric cover material 228 in the source/drain regions from the isotropic etching process.

To counteract etching of the cover material 228 also from above, a mask layer 229 may as shown be formed to cover the dielectric cover material 228. The mask layer 229 may, as indicated in FIG. 13, be formed self-aligned with the capping layer, such that the dummy gate 212 may be exposed by opening the capping 214.

In FIG. 14, the etch stop layer 130 remains on top of the bottom gate electrode 112. The lower gate cavity portion 232 does hence at the stage shown in FIG. 14 not yet expose the bottom gate electrode 112 but may do so by applying a further etch step to open the etch stop layer 130 from the lower gate cavity portion 232. In the illustrated embodiment, opening of the etch stop layer 130 will however be postponed until a later stage, to reduce a risk of damaging an upper surface of the bottom gate electrode 112.

Figure 15:
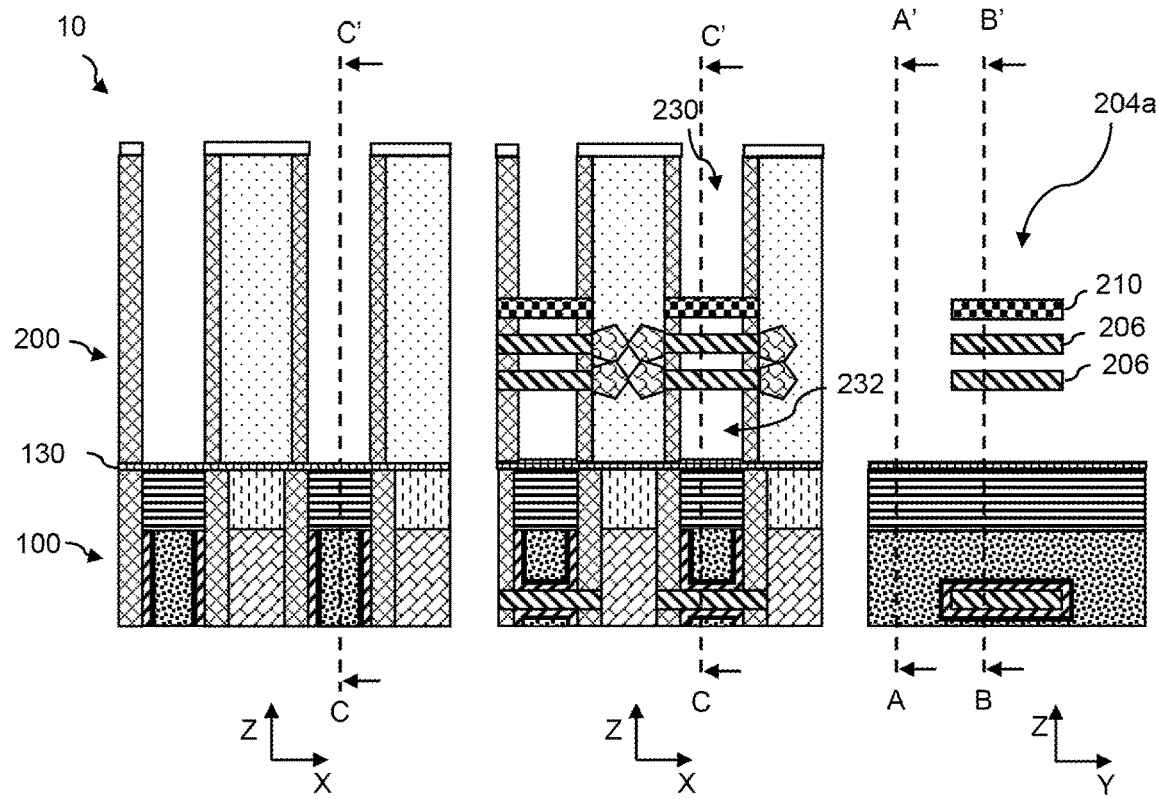

In FIG. 15, the sacrificial layers 208 have been removed from the fin structure portion 204a using an isotropic etch selective to the sacrificial semiconductor material. A same type of etching process may be used for this step as during the forming of the recesses 220. By removing the sacrificial layers 208, the channel layers 206 may be released in the sense that upper and lower surfaces thereof may be exposed within the upper gate cavity portion 230. In particular, a cavity may (as shown) be formed between an upper surface of the top-most channel layer 206 and a lower surface of the dummy layer 210.

Figure 16:
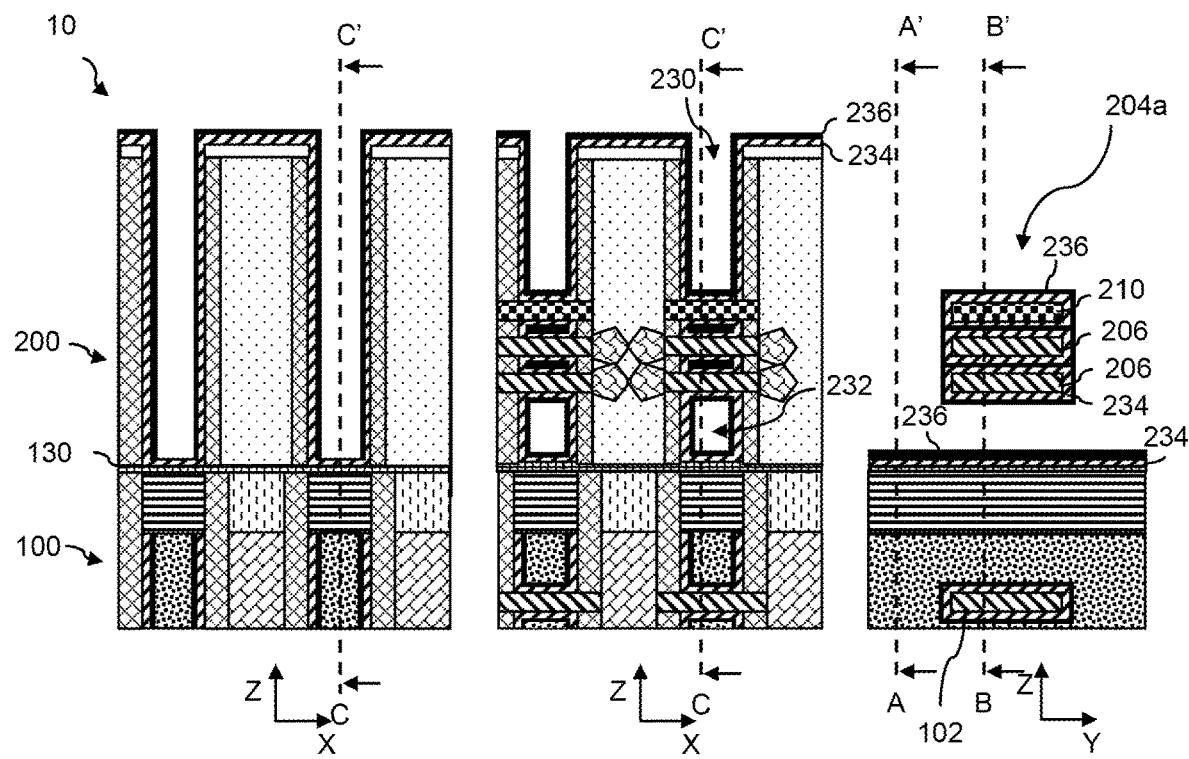

In FIG. 16, a gate dielectric layer 234 and then a (first) work function metal (WFM) layer 236 have been conformally deposited in the upper and lower gate cavity portions 230, 232. The deposition of the WFM layer 236 represents an initial step of forming a gate electrode in the upper and lower gate cavity portions 230, 232. The gate dielectric layer may be formed of a conventional a high-k dielectric e.g. $HfO_2$, HfSiO, LaO, AlO or ZrO. The first WFM 174 may be formed of one or more effective WFMs (e.g. an n-type WFM such as TiAl or TiAlC and/or a p-type WFM such as TiN or TaN). The gate dielectric layer and the first WFM may be deposited by ALD. Owing to the conformal deposition, the layers 234 and 236 may surround the channel layers 206 and the dummy layer 210. The gate dielectric layer 234 and the WFM layer 236 may further be deposited on a bottom surface of the lower gate cavity portion 232, e.g. on the etch stop layer 130.

Figure 17:
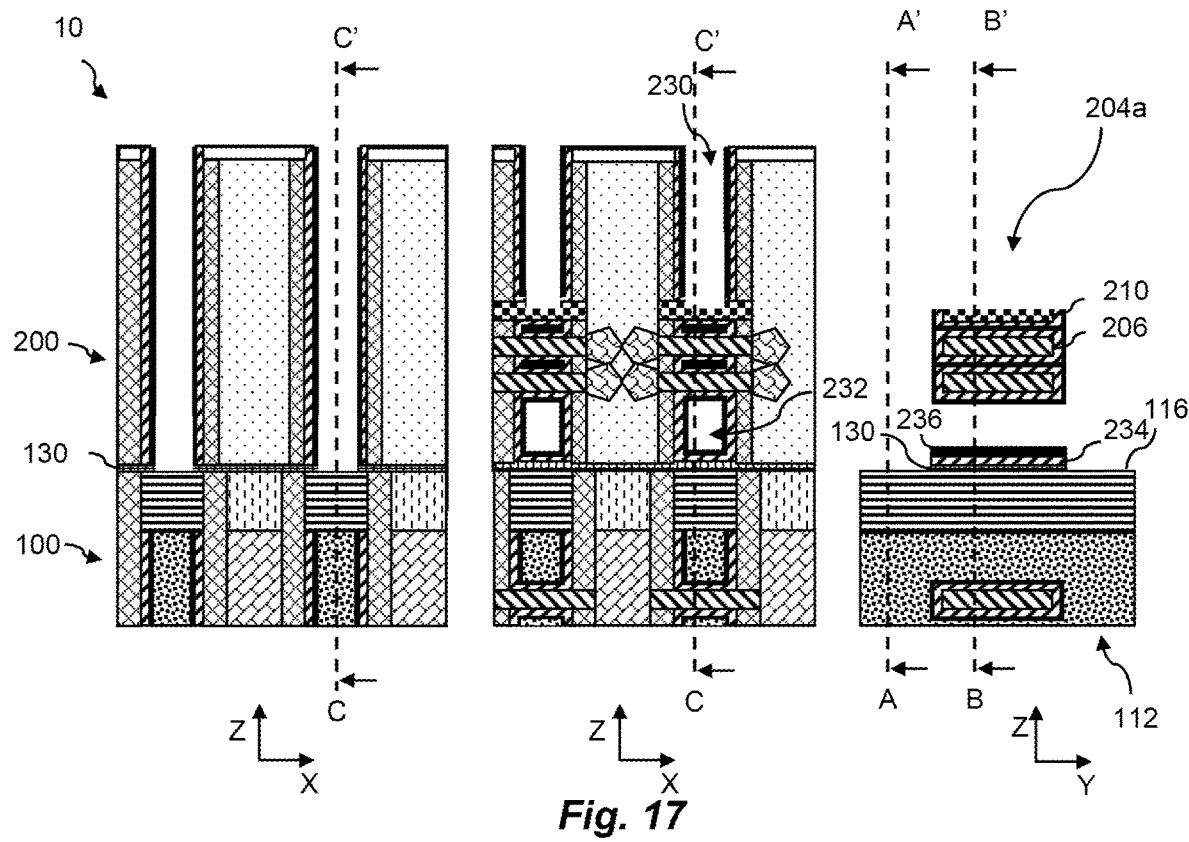

In FIG. 17, the WFM layer 236 and subsequently the gate dielectric layer 234 have each been opened using a top-down anisotropic etch. After opening the gate dielectric layer 234, the etch stop layer 130 may also be opened (e.g. by a top-down anisotropic etch). An upper surface of the bottom gate electrode 112, which in the illustrated embodiment is defined by the gate fill layer 116, is thus exposed in the lower gate cavity portion 232. This completes the formation of the lower gate cavity portion 232. During the etching, the fin structure portion 204a may mask/shadow a portion of the of the WFM layer 236 such that a respective portion of the WFM layer 236, the gate dielectric layer 234 and the etch stop layer 130 remain on the bottom gate electrode 112. The upper surface of the bottom gate electrode 112 may hence be exposed on opposite sides of the fin structure portion 204a, as viewed along a direction transverse to the channel layers 206 (e.g. along the Y-direction).

During the etching, the dummy layer 210 may counteract etching of the portions of the WFM layer 236 and the gate dielectric layer 234 deposited on the top-most channel layer 206, e.g. the portions in the cavity between the dummy layer 210 and the top-most channel layer 206. As the gate dielectric layer 234 and the WFM layer 236 are deposited also on the dummy layer 210, the top-down anisotropic etch may initially remove the portion of the gate dielectric deposited on an upper surface of the dummy layer 210. As illustrated, further etching may result in a partial etch back of the dummy layer 210.

Figure 18:
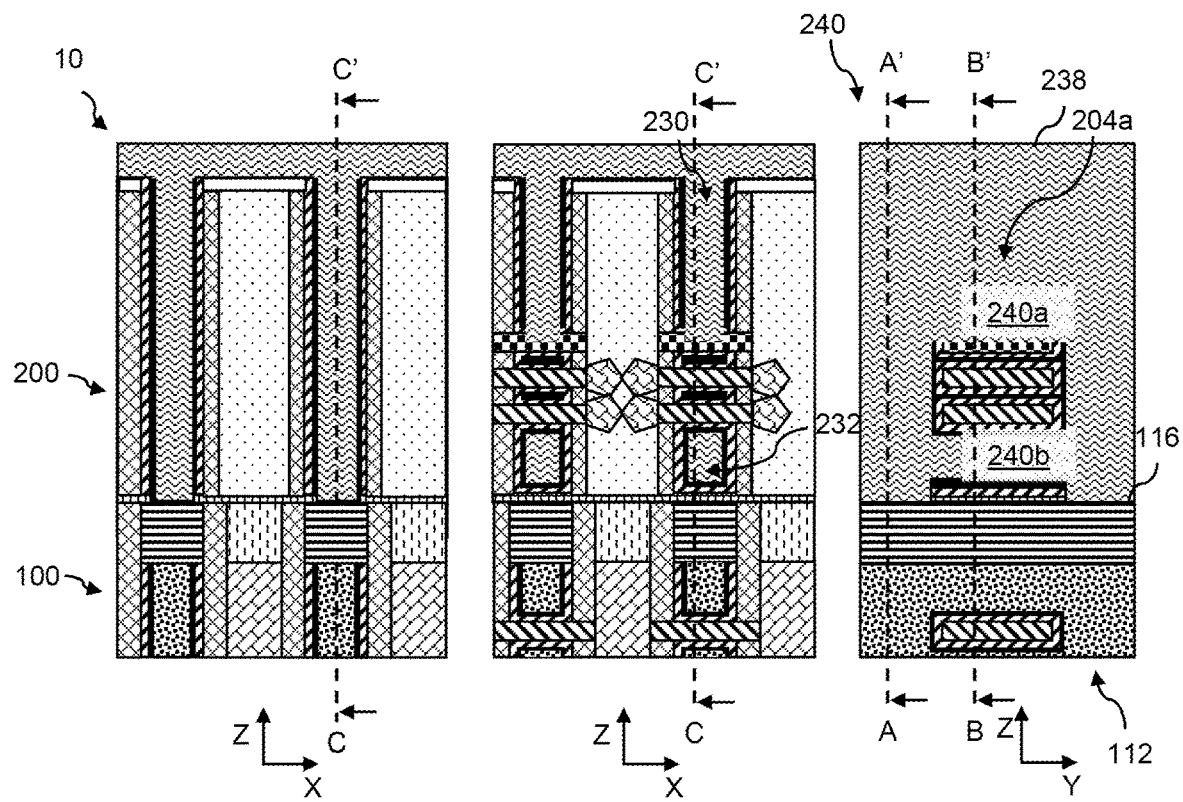

In FIG. 18, one or more further gate electrode materials, commonly referenced 238, have been deposited to fill a remaining space in the lower and upper gate cavity portions 230, 232. The one or more gate electrode materials 238 may comprise one or more conformally deposited gate metals and/or one or more gate fill metals, e.g. of any of the example materials mentioned in connection with the bottom gate electrode 112. The gate electrode material(s) may together with the remaining portions of the work function metal 236 define a top gate electrode 240, comprising an upper gate electrode portion 240a in the upper gate cavity portion 230, and a lower gate electrode portion 240b in the lower gate cavity portion 232. The upper gate electrode portion 240a extends along and surrounds the channel layers 204 and the dummy layer 210. The lower gate electrode portion 240b may be arranged in direct physical and electrical contact with the upper surface of the bottom gate electrode 112.

The top gate electrode 240 may subsequently be recessed (e.g. by a top-down metal etch back) to remove overburden gate electrode materials and define a top gate electrode 240 with a desired height. The method may thereafter proceed with further processing steps, such as forming source/drain contacts and integrating the device 10 in a back-end-of-line interconnect structure, using techniques which per se are known.

The present disclosure has mainly been described with reference to a limited number of examples. However, as is readily appreciated by a person skilled in the art, other examples than the ones disclosed above are equally possible within the scope of the present disclosure, as defined by the appended claims.

For example, the first spacer layer 216 may be removed prior to forming the recesses 220, instead of thereafter.

According to a further example, the gate dielectric layer 234 (and the etch stop layer 130 if present) may be opened prior to depositing the WFM layer 236, wherein the WFM layer 236 may be deposited on the upper surface of the bottom gate electrode 112. This may also be an acceptable option provided the resistivity of the WFM layer 236 is not too high.

According to a further example, in the above the dummy gate 212 is used as an etch mask while etching through the bonding layer 202. In some alternative embodiments, the dummy gate 212 may instead be formed after etching through the bonding layer 202 while using (only) the fin structure 204 as an etch mask. The dummy gate 212 may accordingly be formed to extend across the fin structure 204 and the bonding layer pattern portion preserved underneath the fin structure 204. The method may then proceed as outlined in connection with FIG. 5 and onwards, e.g. by forming the first spacer layer 216 etc. According to this alternative approach, the bonding layer pattern portion 202" resulting from forming the cuts as described in connection with FIGS. 6 and 7, however not comprise portions corresponding to 202b, but only portions corresponding to the portion 202c. Accordingly, the portion 202c is the only remaining portion of the dielectric bonding material which remains to be removed during the lower gate cavity formation 232 (c.f. FIGS. 13-14).

Figure 19:
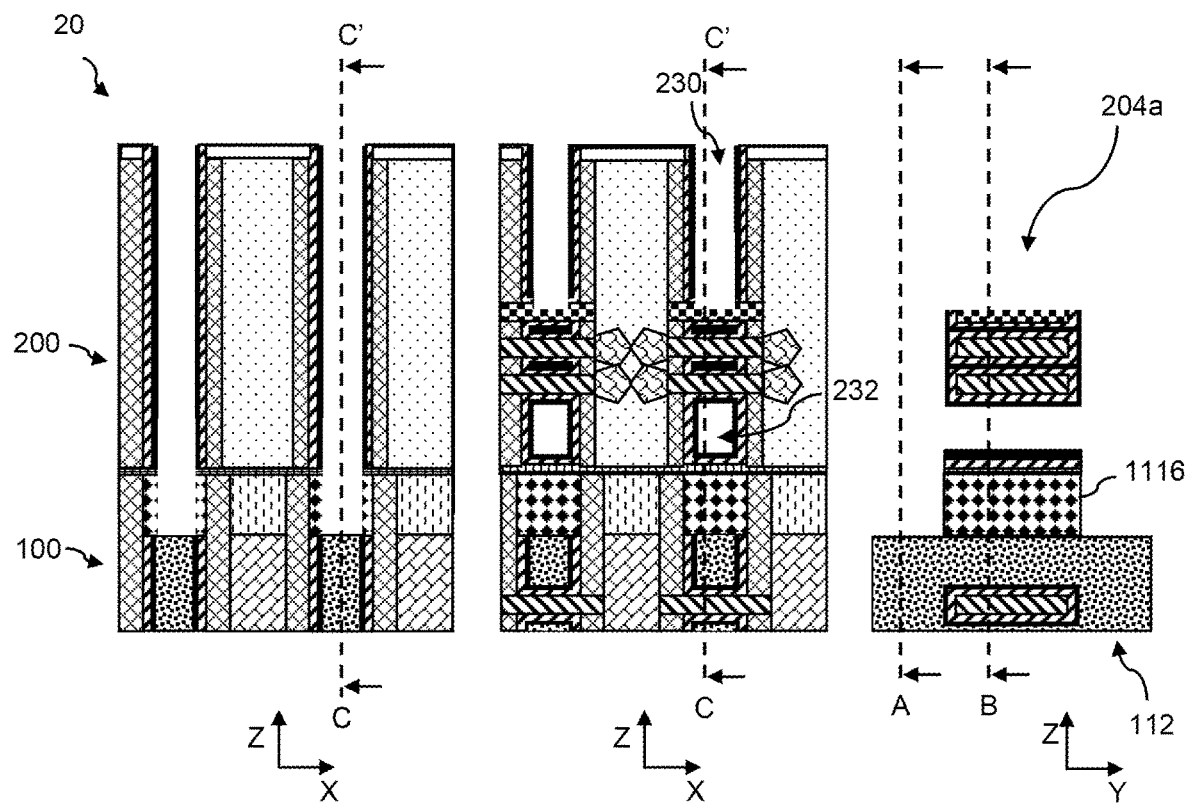
FIGS. 19-20 illustrate a method for forming a stacked field-effect transistor device, according to a further embodiment.
Figure 20:
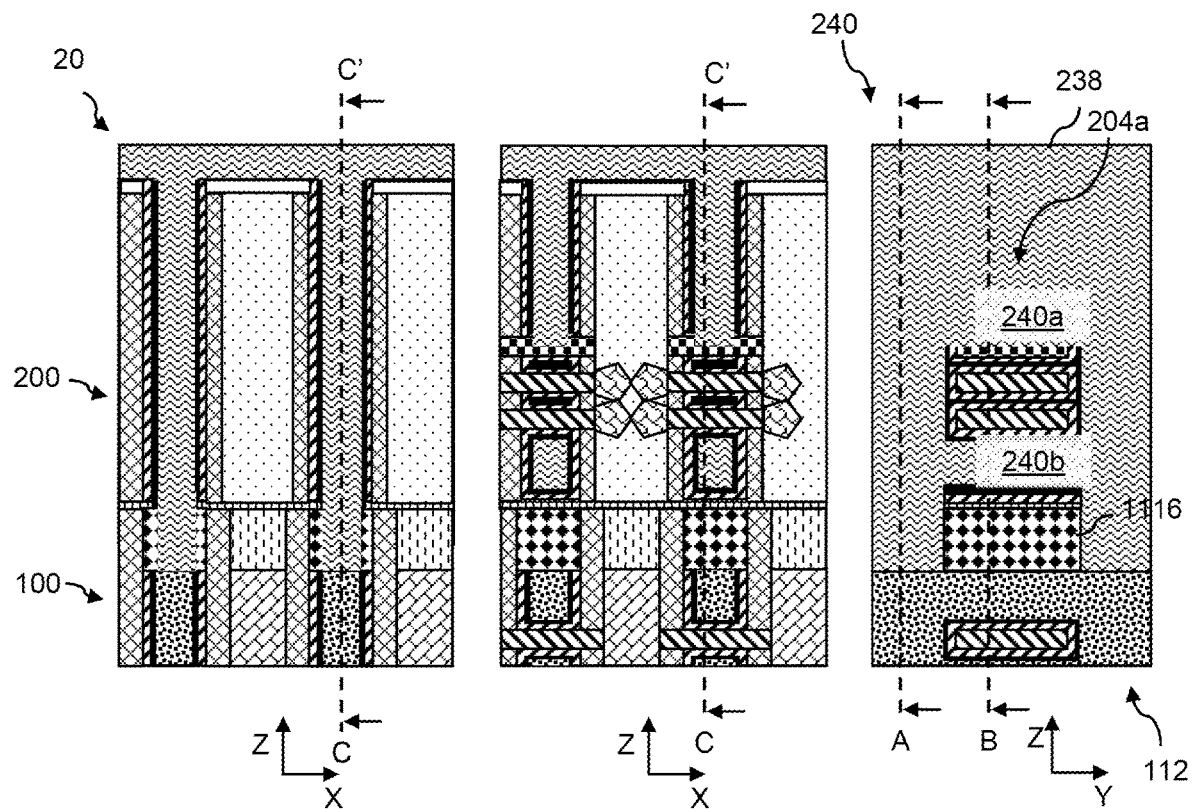

FIGS. 19-20 depict a method according to a further alternative embodiment. The method according to this alternative embodiment is similar to the illustrated embodiment described above, however differs in that the bottom gate electrode 112 is provided with a dielectric cap 1116. The dielectric cap 1116 may, for example, be formed by recessing the bottom gate electrode 112 top-down and filling the space created by the recess with a dielectric capping material. The etch stop layer 130 (if present) and the bonding layer 202 may subsequently be formed on top of the dielectric cap 1116. The method may then proceed as outlined above, with the difference that the forming of the lower gate cavity portion 232 further may comprise opening (i.e. etching through) the cap 1116, to expose an upper surface of the bottom gate electrode 112, as shown in FIG. 19. During the opening of the cap 1116, the dummy layer 210 may serve a similar masking function for the channel layers 206, as described above. The dummy layer 210 may beneficially be formed of a different material than the capping 1116. A portion of the dielectric cap 1116, shadowed by the fin structure portion 204a during the opening of the cap 1116, may remain on the bottom gate electrode 112. FIG. 20 depicts the resulting device 20 subsequent to filling the upper and lower gate cavity portions 230, 232 with gate electrode material 238. As shown, the lower gate electrode portion 240b may thus extend past the remaining portion of the dielectric cap 1116, on either side thereof as viewed along the Y-direction.

The invention claimed is:

1. A method for forming a stacked field-effect transistor (FET) device, the method comprising:
    forming a bottom FET device comprising a source, a drain, a channel layer between the source and drain, and a bottom gate electrode arranged along the channel layer;
    forming a bonding layer of dielectric bonding material over the bottom FET device; and
    forming a top FET device on the bonding layer, wherein forming the top FET device comprises:
    forming on the bonding layer a fin structure comprising a channel layer;
    etching through the bonding layer to form a bonding layer pattern comprising the dielectric bonding material underneath the fin structure;
    forming a dummy gate extending across the fin structure;
    forming a first spacer layer comprising portions covering side surfaces of the dummy gate to define a dummy gate spacer, and portions covering side surfaces of the fin structure and the bonding layer pattern;

subsequent to forming the first spacer layer, forming cuts in the fin structure and the bonding layer pattern, comprising etching through the fin structure and then the bonding layer pattern at either side of the dummy gate such that a fin structure portion on a bonding layer pattern portion is preserved underneath the dummy gate and the dummy gate spacer, wherein the fin structure portion and the bonding layer pattern portion are located above the bottom gate electrode;

forming recesses underneath the fin structure portion by laterally etching back side surface portions of the bonding layer pattern portion exposed at either side of the dummy gate;

removing the first spacer layer and subsequently forming a second spacer layer covering the side surfaces of the dummy gate and filling the recesses and exposing end surfaces of the channel layer of the fin structure portion at either side of the dummy gate;

wherein, subsequent to forming the second spacer layer, the method further comprises:

epitaxially growing source/drain bodies on the exposed end surfaces of the channel layer;

subsequently, removing the dummy gate selectively to the second spacer layer to form an upper gate cavity portion exposing the fin structure portion;

forming a lower gate cavity portion exposing an upper surface of the bottom gate electrode, comprising removing the bonding layer pattern portion by subjecting the bonding layer pattern portion to an isotropic etching process via the upper gate cavity, wherein the etching process etches the dielectric bonding material selectively to a spacer material of the second spacer layer; and forming a gate electrode in the upper and lower gate cavity portions, comprising an upper gate electrode portion extending along the channel layer, and a lower gate electrode portion in contact with the upper surface of the bottom gate electrode.

2. The method according to claim 1, wherein the dummy gate is formed prior to etching the bonding layer, wherein the dummy gate and the fin structure are used as an etch mask while etching the bonding layer such that the bonding layer pattern comprises the dielectric bonding material underneath the fin structure and the dielectric bonding material underneath the dummy gate.

3. The method according to claim 1, further comprising depositing a dielectric cover material over the source/drain bodies and a mask layer over the dielectric cover material, wherein the mask layer acts as an etch mask while removing the bonding layer pattern portion.

4. The method according to claim 3, wherein a capping layer of a hard mask material is provided on the dummy gate, wherein the mask layer is formed to cover the dielectric cover material and expose the capping layer, wherein the method further comprises opening the capping layer selectively to the mask layer to expose the dummy gate and thereafter removing the dummy gate.

5. The method according to claim 1, further comprising, subsequent to removing the dummy gate, conformally depositing a gate dielectric layer, wherein forming the gate electrode comprises depositing a gate electrode material and the method further comprises opening the gate dielectric layer using a top-down anisotropic etch prior to depositing the gate electrode material.

6. The method according to claim 5, wherein the fin structure portion further comprises a dummy layer of a dummy dielectric material above the channel layer, wherein the dummy layer of the fin structure portion counteracts etching of the portion of the gate dielectric layer deposited on the channel layer, during the top-down anisotropic etch used to open the gate dielectric layer.

7. The method according to claim 6, further comprising conformally depositing a work function metal layer on the gate dielectric layer, and opening the work function metal layer using a top-down anisotropic etch and then opening the gate dielectric layer, wherein the dummy layer further counteracts etching of the portion of the work function metal layer deposited on said portion of the gate dielectric layer deposited on the channel layer, during the top-down anisotropic etch used to open the work function metal layer.

8. The method according to claim 5, wherein the fin structure further comprises a sacrificial layer of a sacrificial semiconductor material between the channel layer and the dummy layer, wherein the method further comprises:

subsequent to removing the dummy gate, removing the sacrificial layer from the fin structure portion using an isotropic etch selective to the sacrificial semiconductor material to form a cavity between an upper surface of the channel layer and a lower surface of the dummy layer, and subsequently depositing the gate dielectric layer.

9. The method according to claim 8, further comprising, prior to forming the second spacer layer, forming recesses in the fin structure portion, between the channel layer and the dummy layer, by laterally etching back end surfaces of the sacrificial layer exposed at either side of the dummy gate, wherein the second spacer layer subsequently is formed to further fill the recesses in the fin structure portion.

10. The method according to claim 1, wherein forming the first spacer layer comprises conformally depositing first spacer material and subsequently etching back the deposited first spacer material along the top-down direction such that portions of the deposited first spacer material remain to form the first spacer layer.

11. The method according to claim 1, wherein forming the second spacer layer comprises conformally depositing second spacer material and subsequently etching back the deposited second spacer material such that portions of the deposited second spacer material on horizontally oriented surfaces are removed and portions on vertically oriented surfaces remain to form the second spacer layer.

12. The method according to claim 11, further comprising, subsequent to depositing the second spacer material, forming a block mask on either side of the dummy gate, each block mask being formed with a thickness such that a portion of the second spacer material deposited in the recesses underneath the fin structure portion is covered, wherein the block mask masks said portion of the second spacer material such that said portion of the second spacer material is preserved to define a portion of the second spacer layer in said recesses.

13. The method according to claim 1, further comprising forming an etch stop layer on the bottom FET device, wherein the bonding layer subsequently is formed on the etch stop layer, and wherein forming the lower gate cavity portion further comprising removing a portion of the etch stop layer overlying the bottom gate electrode.

14. The method according to claim 6, wherein the fin structure further comprises a sacrificial layer of a sacrificial semiconductor material between the channel layer and the dummy layer, wherein the method further comprises:

subsequent to removing the dummy gate, removing the sacrificial layer from the fin structure portion using an isotropic etch selective to the sacrificial semiconductor material to form a cavity between an upper surface of the channel layer and a lower surface of the dummy layer, and subsequently depositing the gate dielectric layer.

15. The method according to claim 14, further comprising, prior to forming the second spacer layer, forming recesses in the fin structure portion, between the channel layer and the dummy layer, by laterally etching back end surfaces of the sacrificial layer exposed at either side of the dummy gate, wherein the second spacer layer subsequently is formed to further fill the recesses in the fin structure portion.

16. The method according to claim 7, wherein the fin structure further comprises a sacrificial layer of a sacrificial semiconductor material between the channel layer and the dummy layer, wherein the method further comprises:

subsequent to removing the dummy gate, removing the sacrificial layer from the fin structure portion using an isotropic etch selective to the sacrificial semiconductor material to form a cavity between an upper surface of the channel layer and a lower surface of the dummy layer, and subsequently depositing the gate dielectric layer.

17. The method according to claim 16, further comprising, prior to forming the second spacer layer, forming recesses in the fin structure portion, between the channel layer and the dummy layer, by laterally etching back end surfaces of the sacrificial layer exposed at either side of the dummy gate, wherein the second spacer layer subsequently is formed to further fill the recesses in the fin structure portion.

\* \* \* \* \*